United States Patent
Cao

(10) Patent No.: US 10,408,620 B2
(45) Date of Patent: Sep. 10, 2019

(54) INERTIAL SENSING DEVICE

(71) Applicant: CHANGZHOU SPIDERSENS INTELLIGENT TECHNOLOGY LTD., Changzhou (CN)

(72) Inventor: Yuan Cao, Jiangsu (CN)

(73) Assignee: CHANGZHOU SPIDERSENS INTELLIGENT TECHNOLOGY LTD., Changzhou (CN)

( * ) Notice: Subject to any disclaimer, the term of this patent is extended or adjusted under 35 U.S.C. 154(b) by 347 days.

(21) Appl. No.: 15/505,090

(22) PCT Filed: Jan. 31, 2015

(86) PCT No.: PCT/CN2015/072059
§ 371 (c)(1),
(2) Date: Feb. 19, 2017

(87) PCT Pub. No.: WO2016/033937
PCT Pub. Date: Mar. 10, 2016

(65) Prior Publication Data
US 2019/0154448 A1 May 23, 2019

(30) Foreign Application Priority Data
Sep. 2, 2014 (CN) .......................... 2014 1 0441766

(51) Int. Cl.
*G01C 19/08* (2006.01)
*G01C 19/5712* (2012.01)
(Continued)

(52) U.S. Cl.
CPC ......... *G01C 19/5712* (2013.01); *G01C 19/08* (2013.01); *G01C 21/16* (2013.01);
(Continued)

(58) Field of Classification Search
CPC G01C 19/5707; G01C 19/5712; G01C 19/02; G01C 19/08
See application file for complete search history.

(56) References Cited

U.S. PATENT DOCUMENTS

| 5,408,751 A * | 4/1995 | Rodloff | G01C 19/70 33/316 |
| 7,481,109 B2 * | 1/2009 | Moore | G01C 21/16 73/1.77 |

(Continued)

FOREIGN PATENT DOCUMENTS

| CN | 201081714 Y | 7/2008 |
| CN | 103115617 A | 5/2013 |

(Continued)

OTHER PUBLICATIONS

F. Yu and Q. Sun, "Angular Rate Optimal Design for the Rotary Strapdown Inertial Navigation System," Sensors 2014, pp. 7156-7180, Apr. 2014 (Year: 2014).*

(Continued)

*Primary Examiner* — Peter D Nolan
(74) *Attorney, Agent, or Firm* — Tianchen LLC

(57) ABSTRACT

An inertial sensing device comprising a circuit board provided with an inertial sensor. The inertial sensing device also comprises a base, a rotating plate and a power source assembly. The circuit board is mounted on the rotating plate, the power source assembly is mounted on the base, the rotating plate is drivingly connected to a power output shaft of the power source assembly. The circuit board rotates along with the rotating plate in a reciprocating or a continuous manner at a speed of 1 to 200 RPM. The inertial sensing device is combined with a monitored movable target under operating conditions, and transmits a collected signal to a personal navigation system to display an instantaneous geographic position of the target. The inertial sensing device (Continued)

is low in cost, small in size, and is capable of controlling the heading error within 1°/hour to increase the accuracy of indoor navigation systems.

1 Claim, 20 Drawing Sheets

(51) Int. Cl.
*G01C 21/16* (2006.01)
*G01C 25/00* (2006.01)
*H02J 50/10* (2016.01)
*H05K 1/18* (2006.01)

(52) U.S. Cl.
CPC ............ *G01C 25/005* (2013.01); *H02J 50/10* (2016.02); *H05K 1/181* (2013.01)

(56) References Cited

U.S. PATENT DOCUMENTS

| | | | |
|---|---|---|---|
| 7,509,857 B2 * | 3/2009 | Shirasaka | G01C 19/00 73/504.03 |
| 7,712,223 B2 * | 5/2010 | Imamura | E21B 47/022 33/304 |
| 8,061,048 B2 * | 11/2011 | Imamura | G01C 19/42 33/304 |
| 8,521,428 B1 * | 8/2013 | Liccardo | G01C 25/005 701/511 |
| 8,930,138 B2 * | 1/2015 | Kadosh | G01C 19/38 701/501 |
| 9,279,682 B2 * | 3/2016 | Renault | G01C 19/5691 |
| 9,645,167 B2 * | 5/2017 | Lal | G01P 21/00 |
| 10,132,634 B2 * | 11/2018 | Kadosh | G01C 19/38 |
| 2003/0084704 A1 * | 5/2003 | Hanse | G01C 25/005 73/1.38 |
| 2003/0121328 A1 * | 7/2003 | Karasawa | G01C 19/24 73/504.02 |
| 2007/0245800 A1 * | 10/2007 | Shirasaka | G01C 19/00 73/1.37 |
| 2012/0222319 A1 * | 9/2012 | Roberfroid | G01C 19/56 33/301 |
| 2013/0030700 A1 * | 1/2013 | Miller | G01C 21/16 701/500 |
| 2013/0090848 A1 * | 4/2013 | Kadosh | G01C 19/38 701/501 |
| 2013/0312518 A1 * | 11/2013 | Renault | G01C 19/5691 73/504.08 |
| 2014/0130570 A1 * | 5/2014 | Lal | G01P 21/00 73/1.41 |
| 2015/0204674 A1 * | 7/2015 | Kadosh | G01C 21/16 701/500 |

FOREIGN PATENT DOCUMENTS

| | | |
|---|---|---|
| CN | 203758522 U | 8/2014 |
| EP | 0911635 A1 | 4/1999 |
| EP | WO2012150329 A1 | 11/2012 |
| JP | 1051216 A | 2/1991 |

OTHER PUBLICATIONS

"Pololu 120:1 Mini Plastic Gearmotor 90-Degree 3mm D-Shaft Output," Pololu.com, 2013. Available: https://web.archive.org/web/20131121010450/https://www.pololu.com/product/1124 (Year: 2013).*
Borenstein, J, Ojeda, L., 2010, "Heuristic Drift Elimination for Personnel Tracking Systems." Journal of Navigation, vol. 63, No. 4, Oct. 2010, pp. 591-606.
G.V. Pra-teek, Girisha R, K.V.S. Hari, Peter Hän-del, "Data Fusion of Dual Foot-Mounted INS to Reduce the Sys-tem-atic Head-ing Drift," in Proc. 4th International Conference on Inteiiigent Systems, Modelling and Simulation, Jan. 29-31, 2013, Bangkok, Thailand.

* cited by examiner

INERTIAL SENSING DEVICE

CROSS-REFERENCE TO RELATED APPLICATION

This application claims the priority benefit of International Patent Application Ser. No. PCT/CN2015/072,059, filed Jan. 31, 2015, which is related to and claims the priority benefit of China patent application serial No. 201410441766.3 filed Sep. 2, 2014. The entirety of each of the above-mentioned patent applications is hereby incorporated by reference herein and made a part of this specification.

FIELD OF THE INVENTION

The present invention generally relates to an inertial sensing device, more particularly, to an inertial sensing device of a personal navigation system mounted on a user's feet or shoe, which can be used either indoors or outdoors, for inertial navigation.

BACKGROUND OF THE INVENTION

The term "inertial sensor" throughout the disclosure comprises an accelerometer, a gyroscope, and alternatively a geomagnetic sensor.

Personal navigation systems are being developed for use in various applications. For example, personal navigation systems may be useful for tracking and directing the movements of military personnel in military battlefield environments or military practice maneuvers, for tracking and directing the positions of SWAT personnel during anti-terror actions or hostage rescue actions, for tracking and directing the positions of firefighters at the scene of an accident or fire, and for indoor mapping through user's walking. Especially, with respect to the applications for firefighters, firefighters may get lost, missing or even lose their lives in the fire scene with thick smoke because of the lack of effective indoor navigation and tracking systems. Accordingly, there exists a strong demand for developing effective positioning navigation systems for indoor use, which can be applied in the fields of military battles, military practice maneuvers, anti-terror rescue actions, search and rescue in fire scenes, and indoor mapping, etc.

While the satellite-based navigation technology for outdoor use, such as Global Positioning System (GPS) technology, has been widely used, it is not effective for indoor navigation. Conventional navigation systems for indoor use are generally costly or inaccurate. For example, the installation and maintenance problems are substantial barriers to installation of the base of radio frequency markers within a building. In addition, poor reception of radio frequency navigation signals within a building due to signal block, reflection, attenuation or multi-path effect leads to low positioning accuracy and insufficient signal coverage. Furthermore, multiple story buildings generally require three-dimensional positioning, which pose additional obstacles for accurate positioning.

Another type of navigating system is an inertial navigation system (INS), which comprises a calculating unit and an inertial measurement unit (IMU) containing an accelerometer, a gyroscope and alternatively a geomagnetic sensor. The inertial navigation system continuously reckons the position, orientation, and velocity of a moving object from its initial position, orientation and velocity without external references. The advantage of such navigation method is that it requires no external signals like the GPS signals or other radio frequency signals. However, the biggest shortcoming is that it suffers from accumulative errors. The IMU measures the acceleration and angular velocity, then the acceleration is integrated into velocity and is again integrated into movement distance, the angular velocity is integrated into orientation variation. During the integral operation, small errors in the measurements of acceleration and angular velocity are accumulated, which is compounded into greater errors in position.

The above accumulative errors generated in the inertial navigation system can be greatly reduced by mounting the IMU to feet or shoe of a user to be periodically motionless relative to the ground during the user's walking and adapting Zero Velocity Update (ZUPT) algorithm. However, the accumulated heading errors cannot be eliminated. Small heading bias may be enlarged to a great error by a long distance. For example, a heading bias of 3° will be enlarged to an error of 5.2 meters by a distance of 100 meters, which equals to one or two rooms in the indoor environment.

The primary cause of the heading error is that the gyroscope of the inertial sensor has zero drift, that is, even when the input angular velocity of the gyroscope is zero, the output angular velocity is not zero. Zero drift is an important index to evaluate the performance of the gyroscope. For a MEMS gyroscope, its core sensitive components and processing circuits are prone to be affected by complicated ambient environments. For example, either of the environmental factors like temperature, electromagnetism, vibration, radiation, gravity anomaly, humidity and pressure may affect the performance of the core sensitive components and processing circuits of the gyroscope, and may reduce the output measurement accuracy. These environmental factors are not easy to be quantified or studied precisely. The coupling and accumulation of the errors caused by these factors may result in a total error with strong randomicity and lack of regularity. Therefore, even the strict use of standard gyroscope testing, calibrating, modeling and compensating method to process the errors caused by the above environmental factors will not improve the accuracy of the gyroscope effectively.

Nowadays, one major way to overcome the above zero drift problem is establishing a model for motion of the gyroscope and then compensating for bias of the gyroscope according to the model. However, the zero drift of the gyroscope is characterized by small nonlinearity, non-stationarity and slow time variability, which requires online real-time fitting modeling and parameter identification to achieve good compensation results, making the compensation more difficult in a real-time system.

Other sensors, such as GPS sensors or magnetic sensors are used to detect heading directions, so as to overcome the problem of accumulative heading errors caused by the zero drift of the gyroscope. Nevertheless, with respect to the indoor environment, the GPS signals may be blocked by buildings to be ineffective; the magnetic sensors may be unreliable due to magnetic field interferences caused by iron or other materials inside the buildings. Accordingly, IMU with high performance are required to solve the above problems. However, the size, cost and structural complexity of such IMU with high performance also set limits to the actual application environment, which results in raised system cost and increased size of the whole system even to an extent that dissatisfying the application requirements. For example, a MEMS gyroscope with zero drift of less than 1° per hour costs tens of thousands of RMB, while fiber optic gyroscope of higher performance is more costly and becomes too big in size to be mounted on feet or shoe.

BRIEF SUMMARY OF THE DISCLOSURE

Accordingly, an objective of the present invention is to provide an inertial sensing device which is not only low in production cost and small in size, but also capable of controlling the heading error within 1 degree per hour to greatly increase the accuracy of the navigation system for indoor use, so as to overcome the above deficiencies in the prior art.

In order to achieve the above objective, the present invention provides an inertial sensing device comprising a circuit board and an inertial sensor provided on the circuit board. The inertial sensing device is characterized by also comprising a base, a rotating plate and a power source assembly. Wherein, the circuit board is mounted on the rotating plate, the power source assembly is mounted on the base, the rotating plate is drivingly connected to a power output shaft of the power source assembly. The circuit board rotates along with the rotating plate in a reciprocating manner or a continuous manner at a rotation speed of 1 to 200 RPM. The inertial sensing device is combined with a monitored movable target under operating conditions, a signal collected by the inertial sensor is transmitted to a personal navigation system to display an instantaneous geographic position of the monitored movable target.

In the above technical solution, the power source assembly comprises a first motor and a first speed reducer drivingly connected to the first motor, which are both mounted on the base. Wherein the power output shaft is a power output shaft of the first speed reducer and is sleeved by the rotating plate. The circuit board rotates along with the rotating plate in a reciprocating manner.

In the above technical solution, the circuit board further comprises a first wireless power receiving module, a first wireless communication module, a first wireless power receiving coil, a first insulating sheet and a first microprocessor. The first wireless power receiving coil is mounted on the circuit board through the first insulating sheet and is electrically connected to a corresponding connection terminal of the first wireless power receiving module. The first wireless power receiving module, the first wireless communication module and the inertial sensor are electrically connected to corresponding connection terminals of the first microprocessor respectively.

In the above technical solution, the inertial sensing device further comprises a first frame and a first slip ring. The first frame has an inverted L-shape with a lower portion fixed on the base and a top portion mounted with the first slip ring. The power source assembly comprises a second motor and a second speed reducer drivingly connected to the second motor, which are both mounted on the base. The power output shaft is a power output shaft of the second speed reducer which is sleeved by the rotating plate. A first rotor of the first slip ring is drivingly connected to the power output shaft of the second speed reducer.

In the above technical solution, the inertial sensing device further comprises a second slip ring which is mounted on the base. A second rotor of the second slip ring is assembled to the rotating plate. The power source assembly comprises a third motor, a third speed reducer drivingly connected to the third motor which are both mounted on the base, and a first driving gear. The power output shaft is a power output shaft of the third speed reducer and is sleeved by the first driving gear. The rotating plate is a driven gear engaged with the first driving gear.

In the above technical solution, the power source assembly comprises a fourth motor, a fourth speed reducer drivingly connected to the fourth motor which are both mounted on the base, a first rotating shaft and a second driving gear. The power output shaft is a power output shaft of the fourth speed reducer which is sleeved by the second driving gear. The rotating plate is a driven gear engaged with the second driving gear. The first rotating shaft is assembled to the base, the rotating plate is assembled to the first rotating shaft. The circuit board further comprises a second wireless power receiving module, a second wireless communication module, a second wireless power receiving coil, a second insulating sheet and a second microprocessor. The second wireless power receiving coil is mounted on the circuit board through the second insulating sheet and is electrically connected to a corresponding connection terminal of the second wireless power receiving module. The second wireless power receiving module, the second wireless communication module and the inertial sensor are electrically connected to corresponding connection terminals of the second microprocessor respectively.

In the above technical solution, the inertial sensing device further comprises a second frame and a third slip ring. The second frame has an inverted L-shape with a lower portion fixed on the base and a top portion mounted with the third slip ring. The power source assembly comprises a fifth motor, a first positioning block, a third driving gear, a first internal gear and a second rotating shaft. The fifth motor is mounted on the rotating plate. The power output shaft is a power output shaft of the fifth motor which is assembled to the third driving gear by passing through the rotating plate. The third driving gear is engaged with internal gear teeth of the first internal gear. The first internal gear and the first positioning block are both fixed on the base, the first positioning block is disposed inside the first internal gear. One terminal of the second rotating shaft passes through the first positioning block to be assembled to the base. The rotating plate and the circuit board are arranged on an upper surface of the first positioning block by receiving the second rotating shaft. The other terminal of the second rotating shaft is assembled to a third rotor of the third slip ring.

In the above technical solution, the power source assembly comprises a sixth motor, a second positioning block, a fourth driving gear, a second internal gear and a third rotating shaft. The sixth motor is mounted on the rotating plate. The power output shaft is a power output shaft of the sixth motor which is assembled to the fourth driving gear by passing through the rotating plate. The fourth driving gear is engaged with internal gear teeth of the second internal gear. The second internal gear and the second positioning block are both fixed on the base, the second positioning block is disposed inside the second internal gear. One terminal of the third rotating shaft passes through the second positioning block to be assembled to the base. The rotating plate and the circuit board are arranged on an upper surface of the second positioning block by receiving the third rotating shaft. The circuit board further comprises a third wireless power receiving module, a third wireless communication module, a third wireless power receiving coil, a third insulating sheet and a third microprocessor. The third wireless power receiving coil is mounted on the circuit board through the third insulating sheet and is electrically connected to a corresponding connection terminal of the third wireless power receiving module. The third wireless power receiving module, the third wireless communication module and the inertial sensor are electrically connected to corresponding connection terminals of the third microprocessor respectively.

The present invention has the following advantages: when used, the inertial sensing device is mounted on a user's foot or shoe, and the power source assembly is fed by direct current. Under operating conditions, the inertial sensor (gyroscope) on the circuit board rotates along with the rotating plate in a reciprocating manner or a continuous manner. Due to the rotation of the inertial sensor under the operating conditions, a direction of a sensitive axis (x/y/z axis) of the inertial sensor periodically varies, which also periodically changes errors associated with the sensitive axis in the navigation system. For example, when the rotating plate rotates around a horizontal axis, the components of the zero drift associated with a sensitive axis in a vertical plane at two positions about 180 degree from each other are equal in magnitude but opposite in direction, such that the integrations of the zero drift or the heading bias at the two positions can be canceled out. Accordingly, most of the zero drift of the inertial sensor can be modulated and navigation errors occurred in different directions caused by the zero drift of the inertial sensing device can be canceled out, which greatly reduces the heading error. The inertial sensing device of the present invention is not only low in production cost and small in size, but also capable of controlling the heading error within 1 degree per hour, which significantly increases the accuracy of the navigation system for indoor use.

BRIEF DESCRIPTION OF THE DRAWINGS

Example embodiments will now be described more fully hereinafter with reference to the accompanying drawings. Obviously, the accompanying drawings should be understood to provide a representation of particular embodiments of the invention, and other drawings can also be realized by those skilled in the art without creative work.

DETAILED DESCRIPTION OF THE EMBODIMENTS

Figure 1:
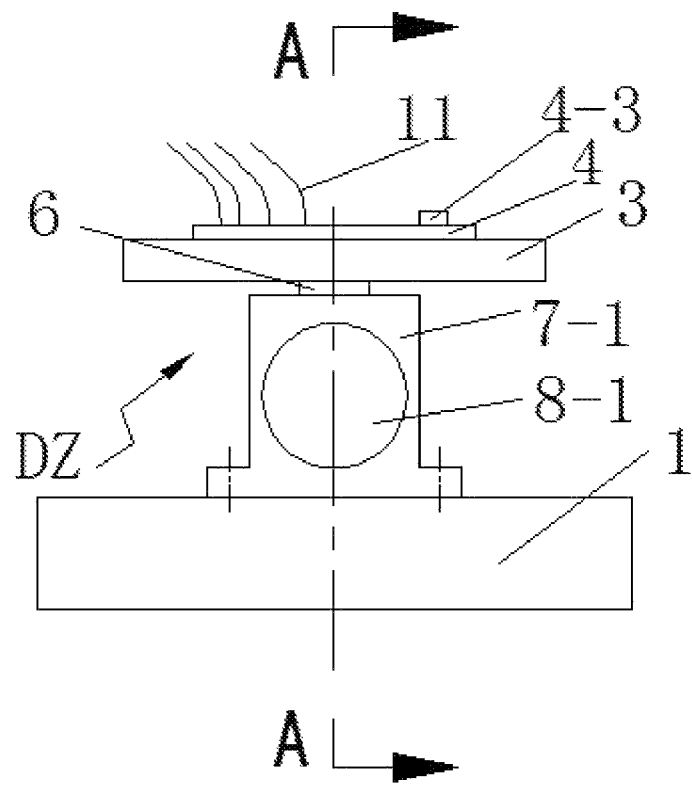
FIG. 1 is a structural view of an inertial sensing device according to a first embodiment of the present invention in which a first wire 11 is lead from a circuit board 4.
Figure 2:
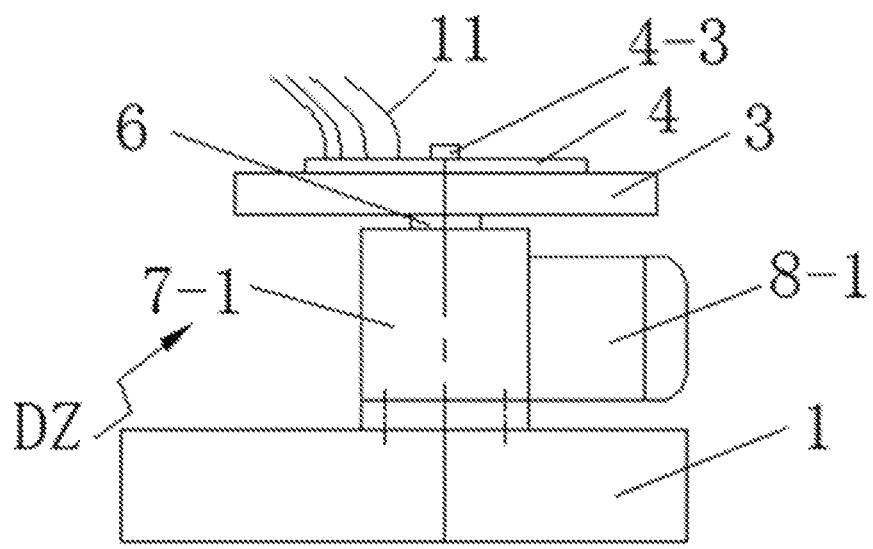
FIG. 2 is a left view of the inertial sensing device of FIG. 1.
Figure 3:
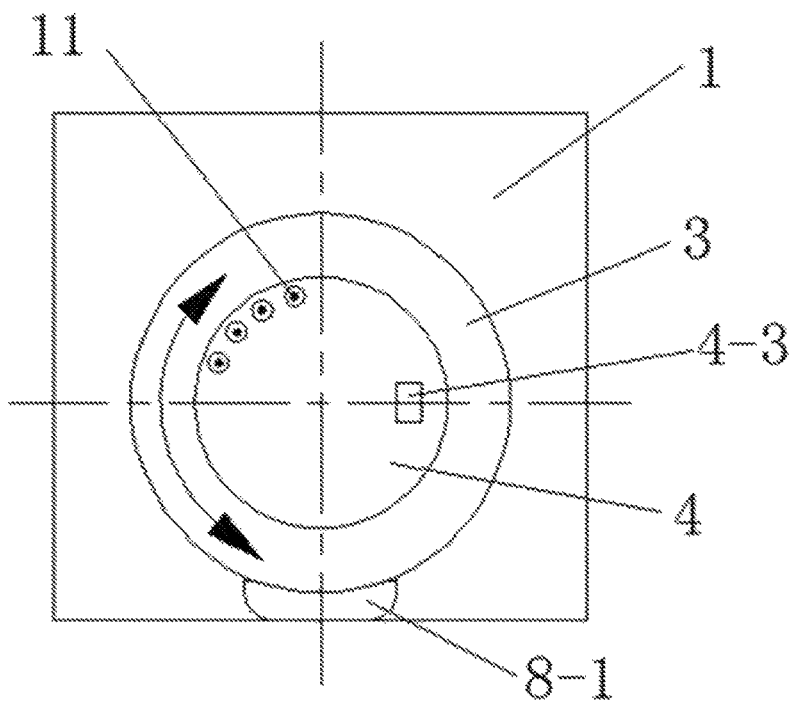
FIG. 3 is a top view of the inertial sensing device of FIG. 1.
Figure 4:
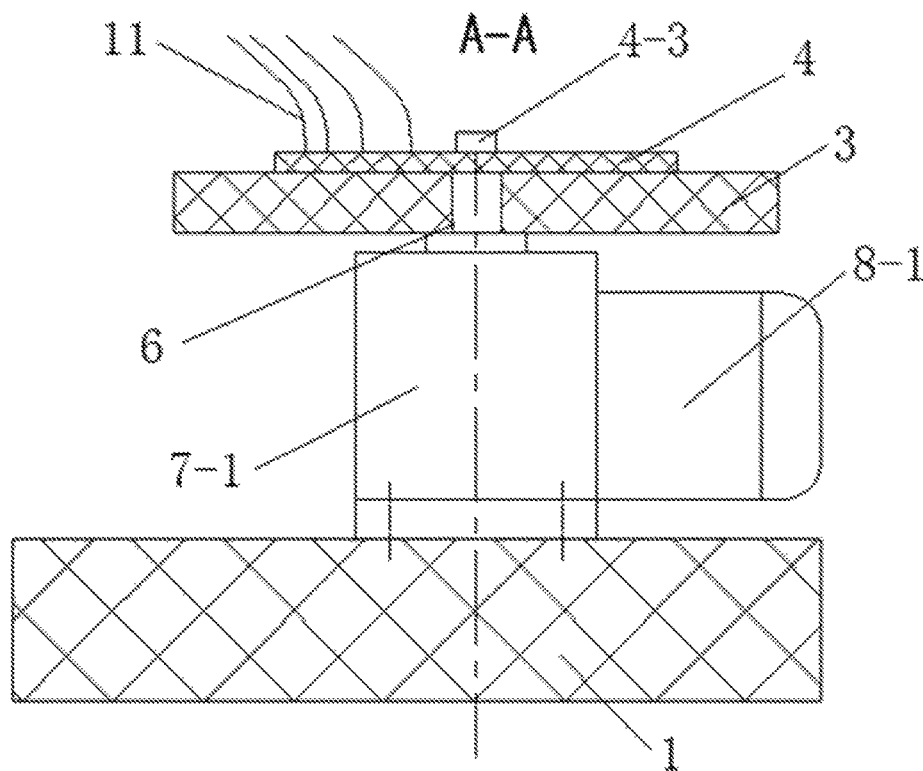
FIG. 4 is a cross section view of the inertial sensing device of FIG. 1 at a position similar to line A-A.
Figure 5:
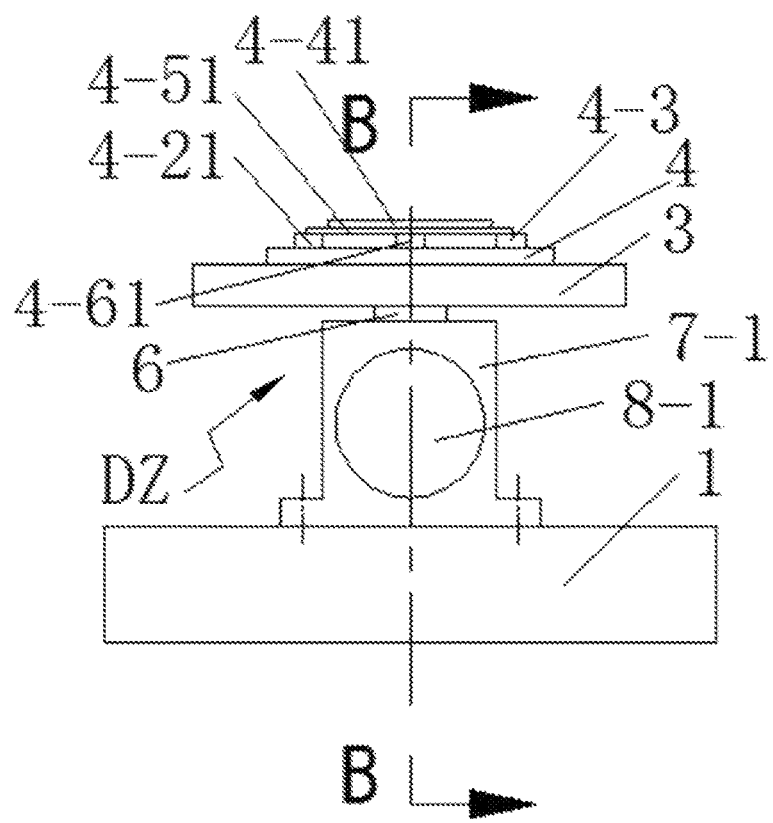
FIG. 5 is a structural view of an inertial sensing device according to a second embodiment of the present invention.
Figure 6:
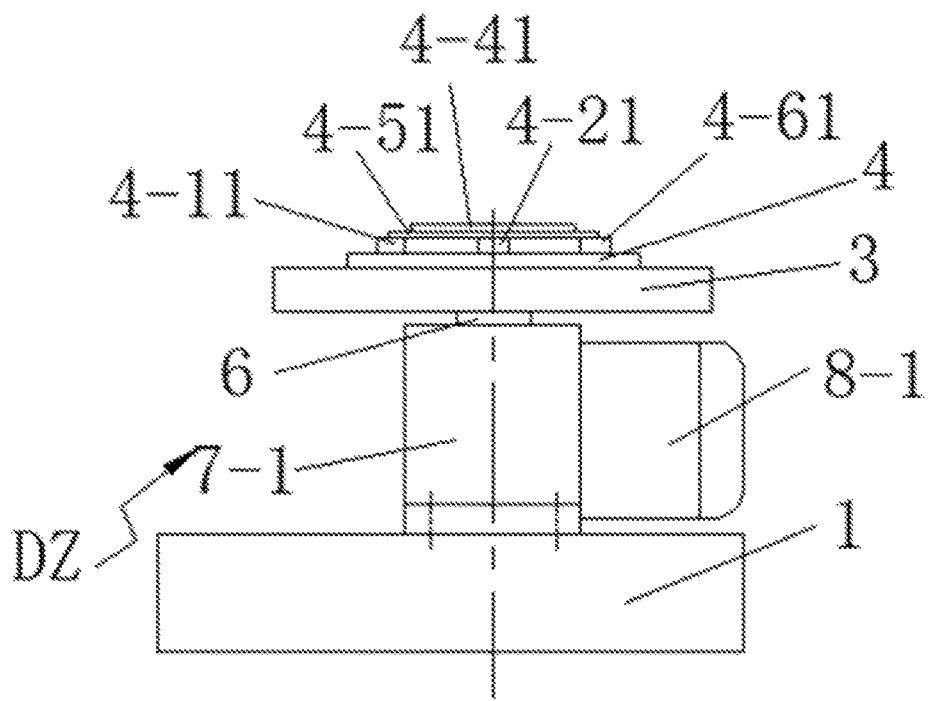
FIG. 6 is a left view of the inertial sensing device of FIG. 5.
Figure 7:
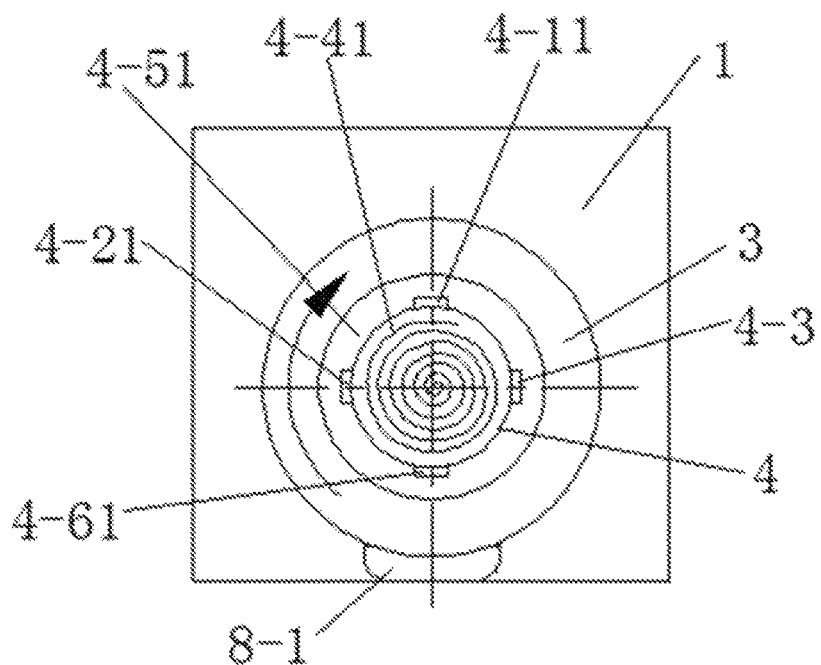
FIG. 7 is a top view of the inertial sensing device of FIG. 5.
Figure 8:
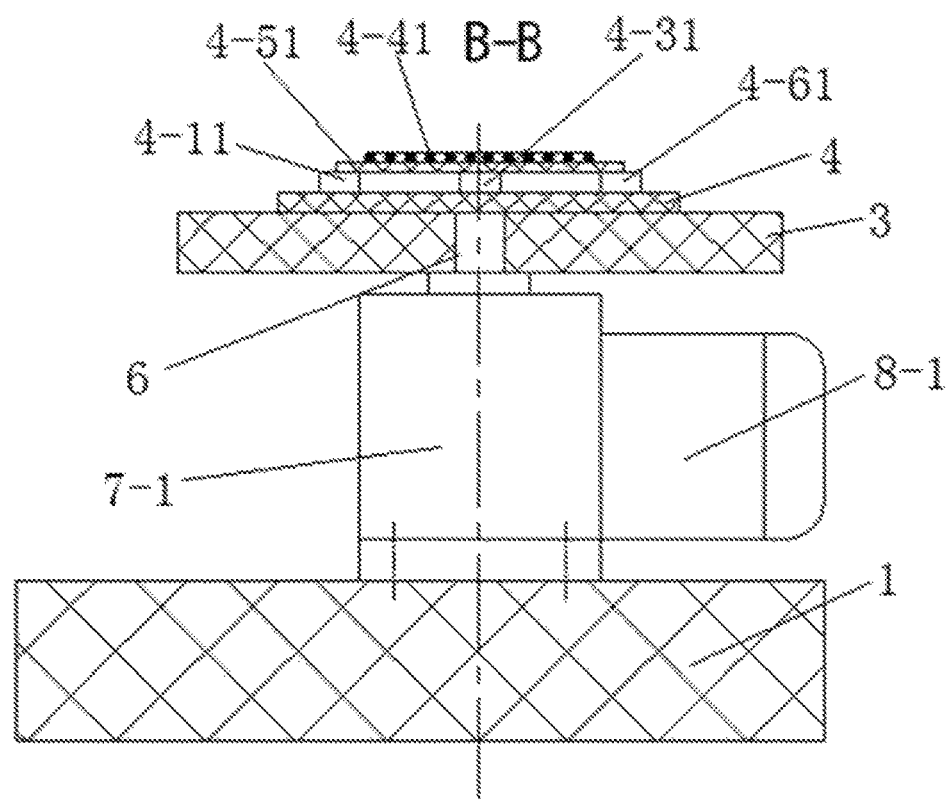
FIG. 8 is a cross section view of the inertial sensing device of FIG. 5 at a position similar to line B-B.
Figure 9:
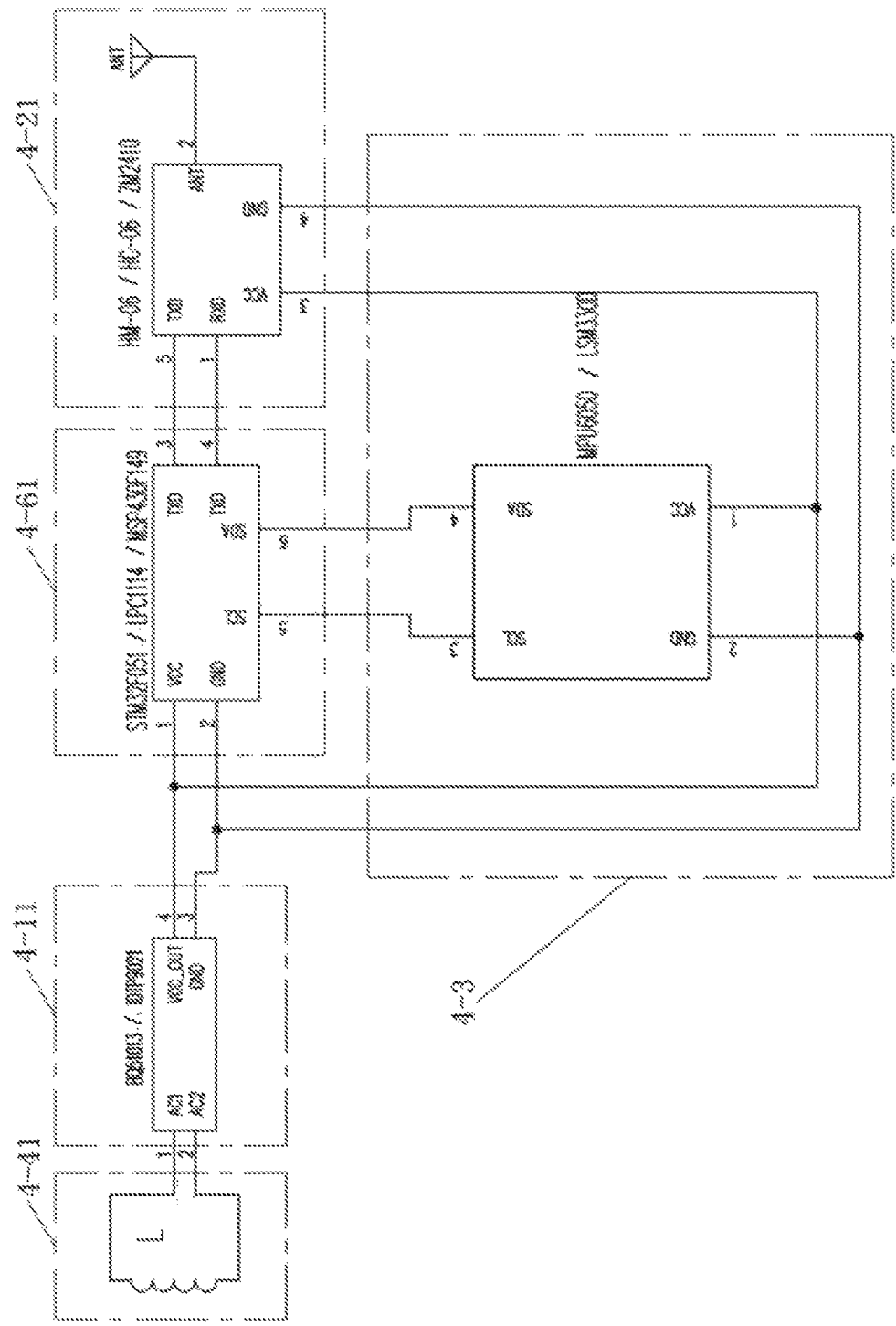
FIG. 9 is a circuit diagram of a circuit of the inertial sensing device of FIG. 5.
Figure 10:
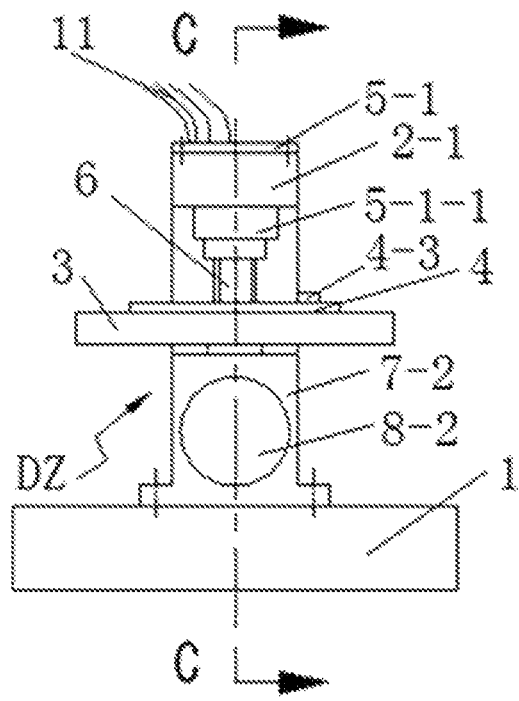
FIG. 10 is a structural view of an inertial sensing device according to a third embodiment of the present invention.
Figure 11:
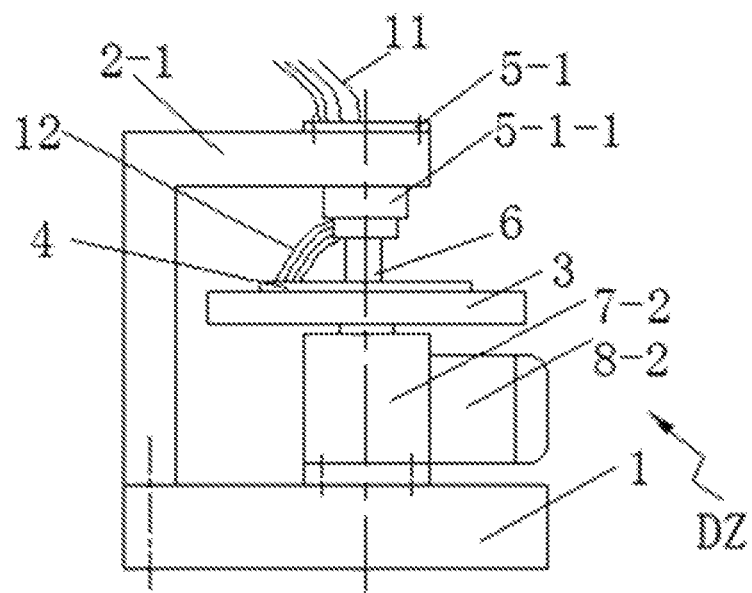
FIG. 11 is a left view of the inertial sensing device of FIG. 10.
Figure 12:
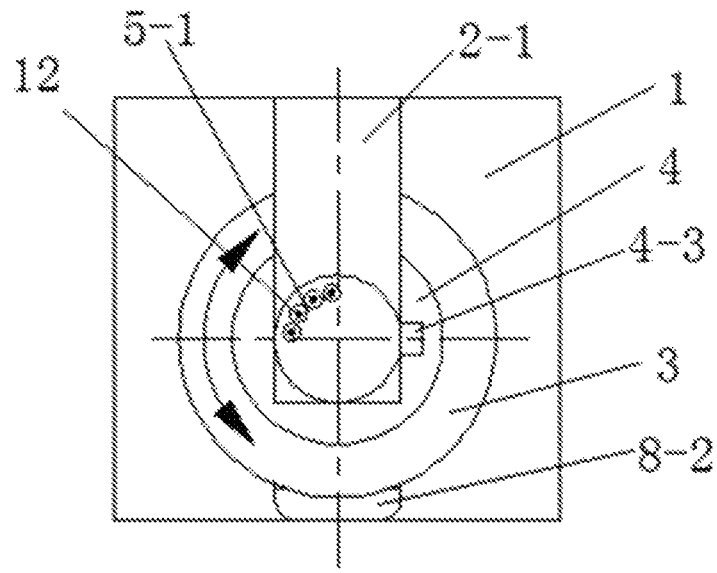
FIG. 12 is a top view of the inertial sensing device of FIG. 10.
Figure 13:
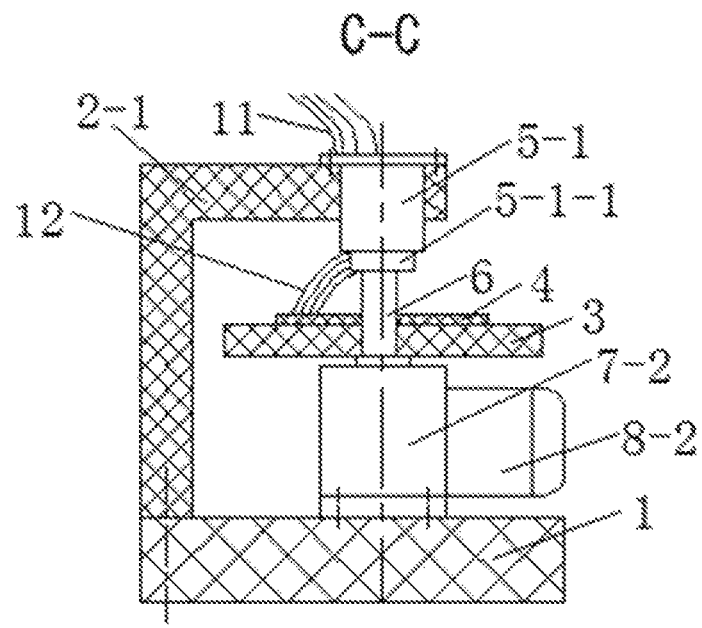
FIG. 13 is a cross section view of the inertial sensing device of FIG. 10 at a position similar to line C-C.
Figure 14:
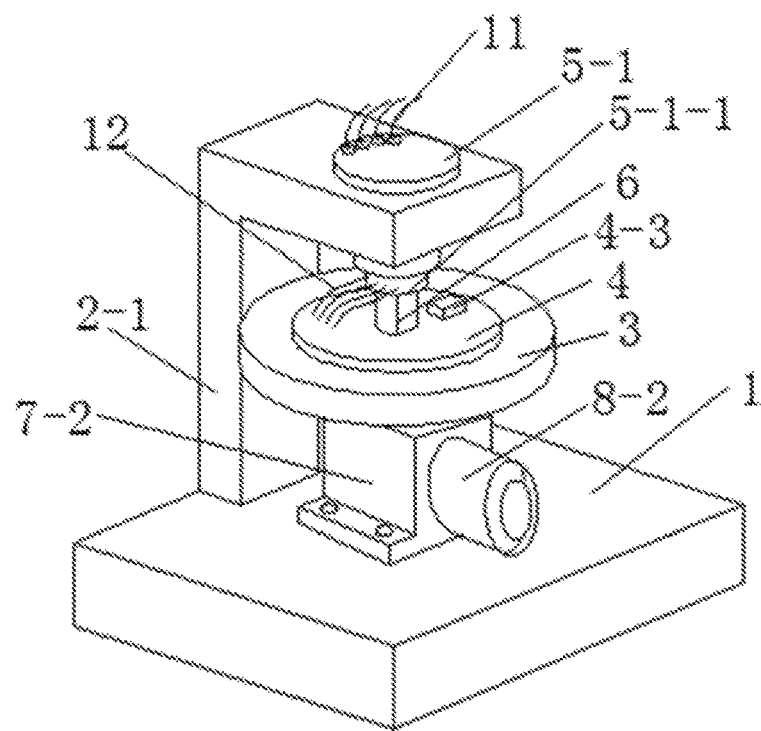
FIG. 14 is a three-dimensional view of the inertial sensing device of FIG. 10 in which a first wire 11 is lead from a circuit board 4 and a second wire 12 is lead from the circuit board 4.
Figure 15:
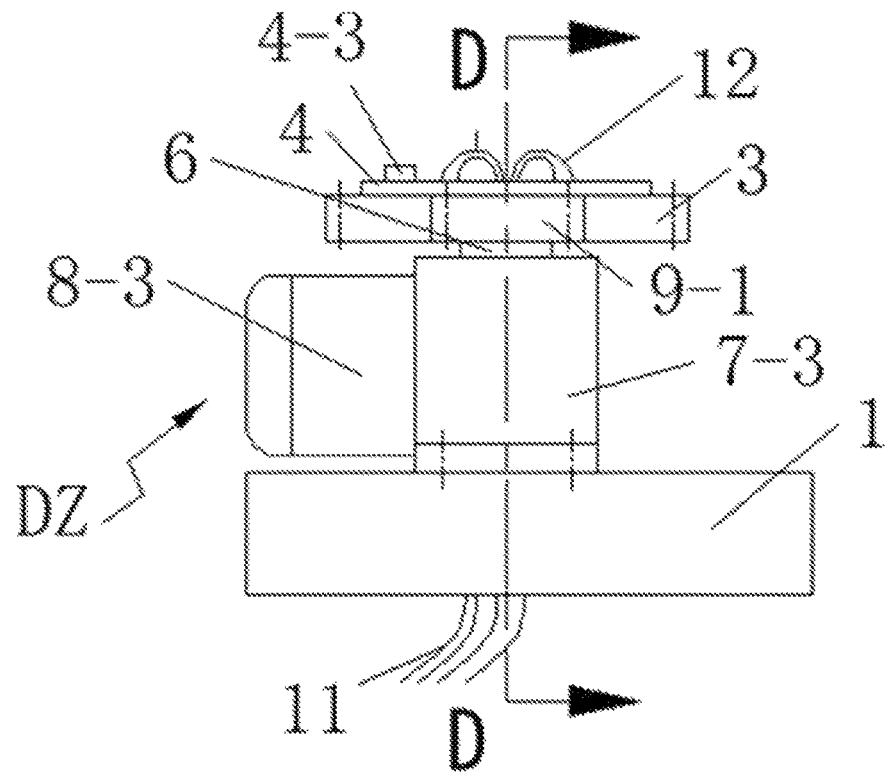
FIG. 15 is a structural view of an inertial sensing device according to a fourth embodiment of the present invention in which a first wire 11 is lead from a circuit board 4.
Figure 16:
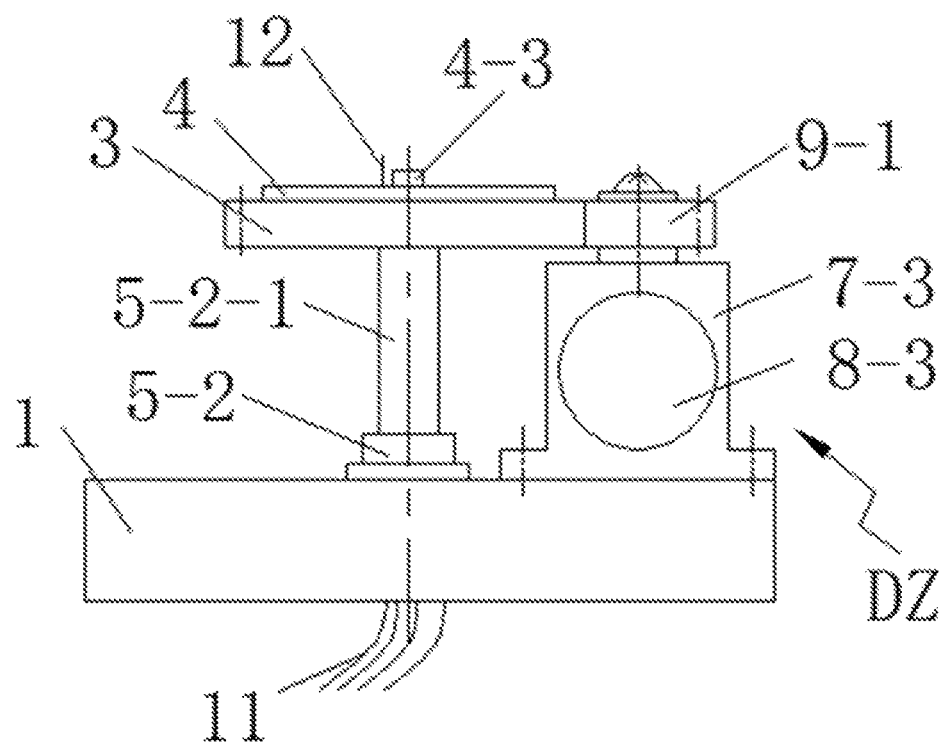
FIG. 16 is a left view of the inertial sensing device of FIG. 15.
Figure 17:
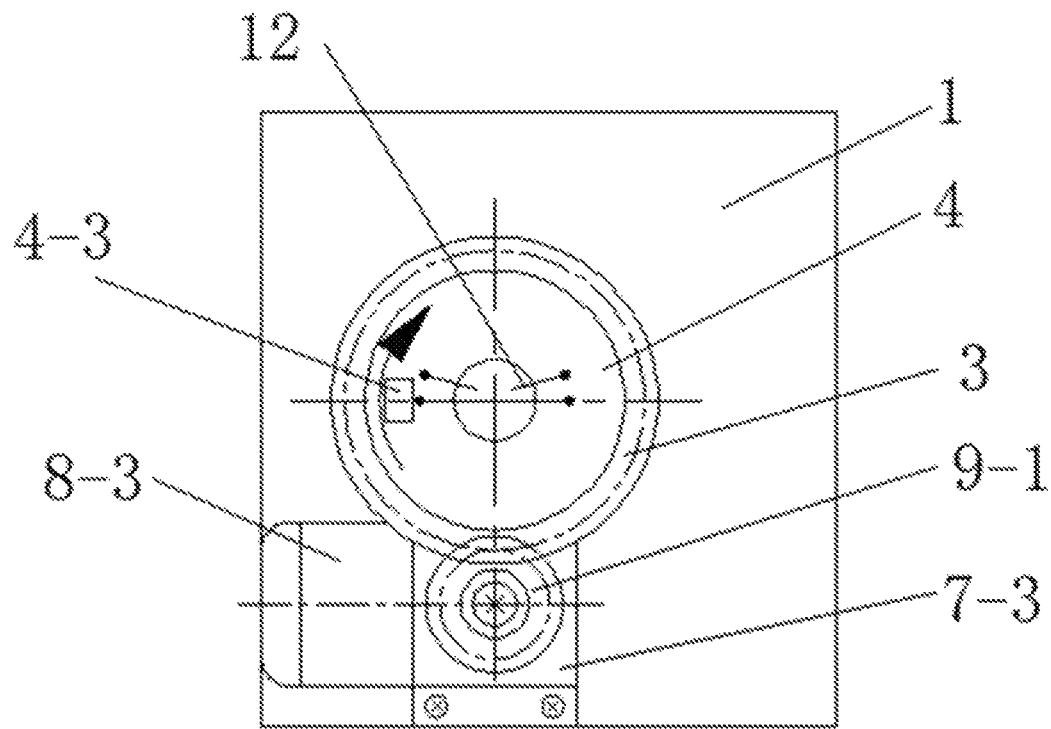
FIG. 17 is a top view of the inertial sensing device of FIG. 15.
Figure 18:
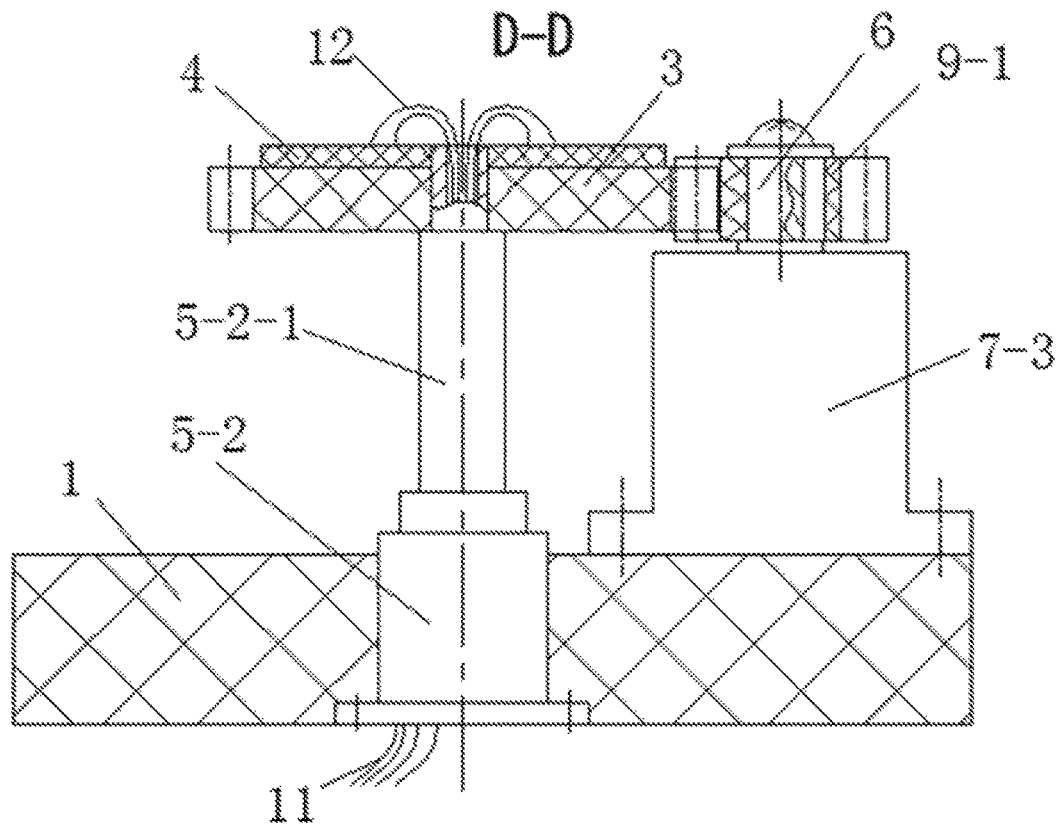
FIG. 18 is a cross section view of the inertial sensing device of FIG. 15 at a position similar to line D-D.
Figure 19:
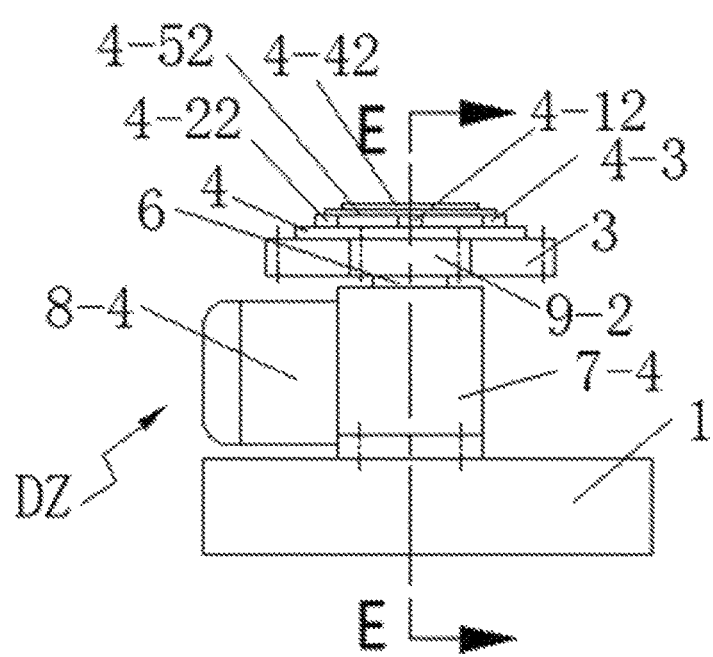
FIG. 19 is a structural view of an inertial sensing device according to a fifth embodiment of the present invention.
Figure 20:
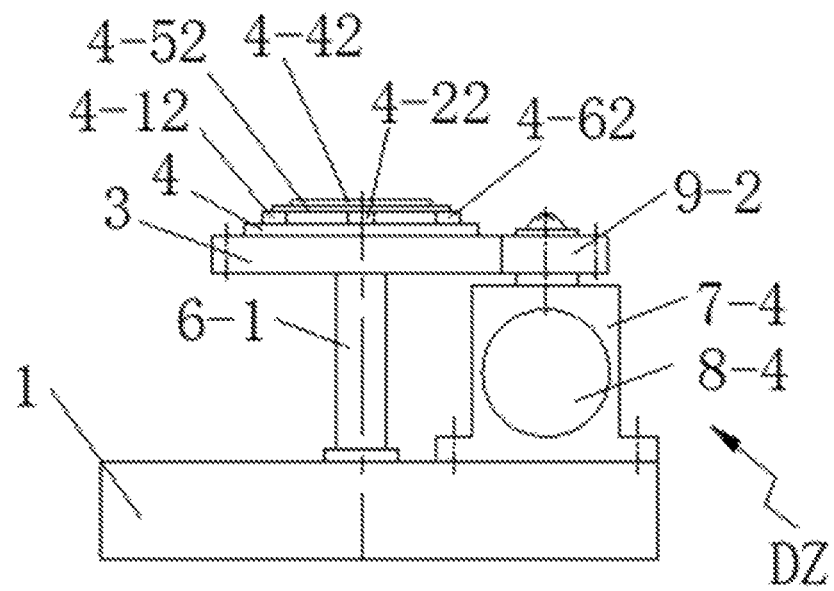
FIG. 20 is a left view of the inertial sensing device of FIG. 19.
Figure 21:
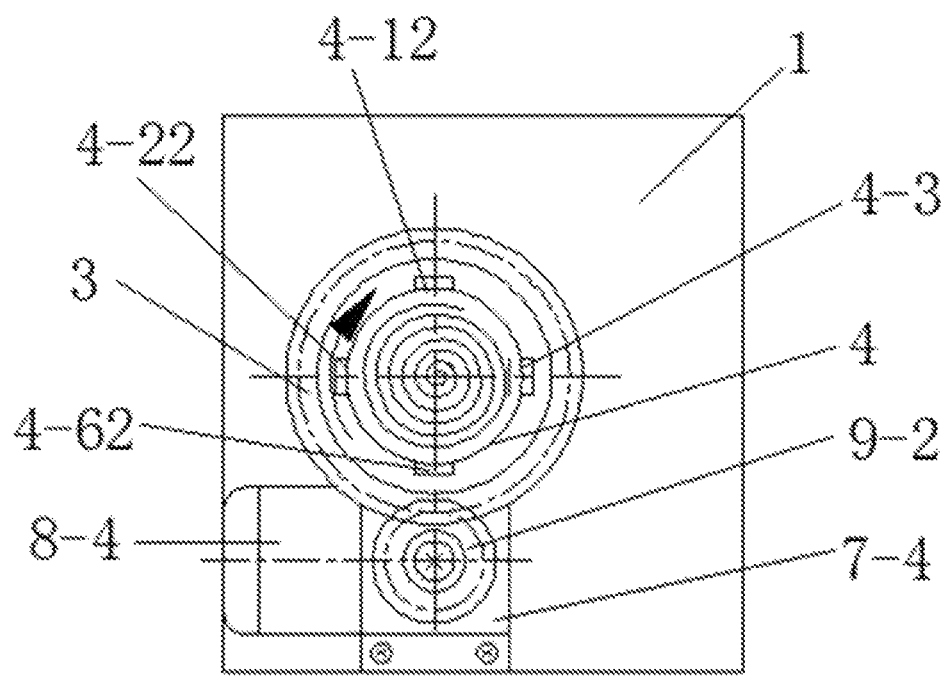
FIG. 21 is a top view of the inertial sensing device of FIG. 19.
Figure 22:
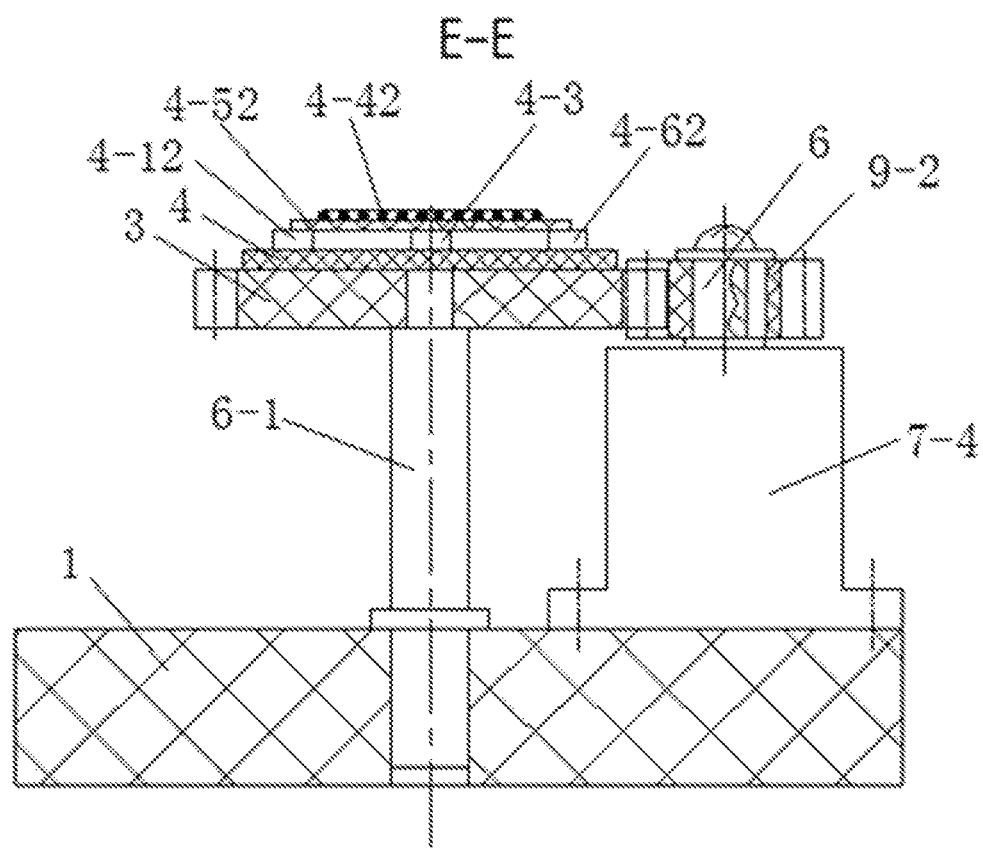
FIG. 22 is a cross section view of the inertial sensing device of FIG. 19 at a position similar to line E-E.
Figure 23:
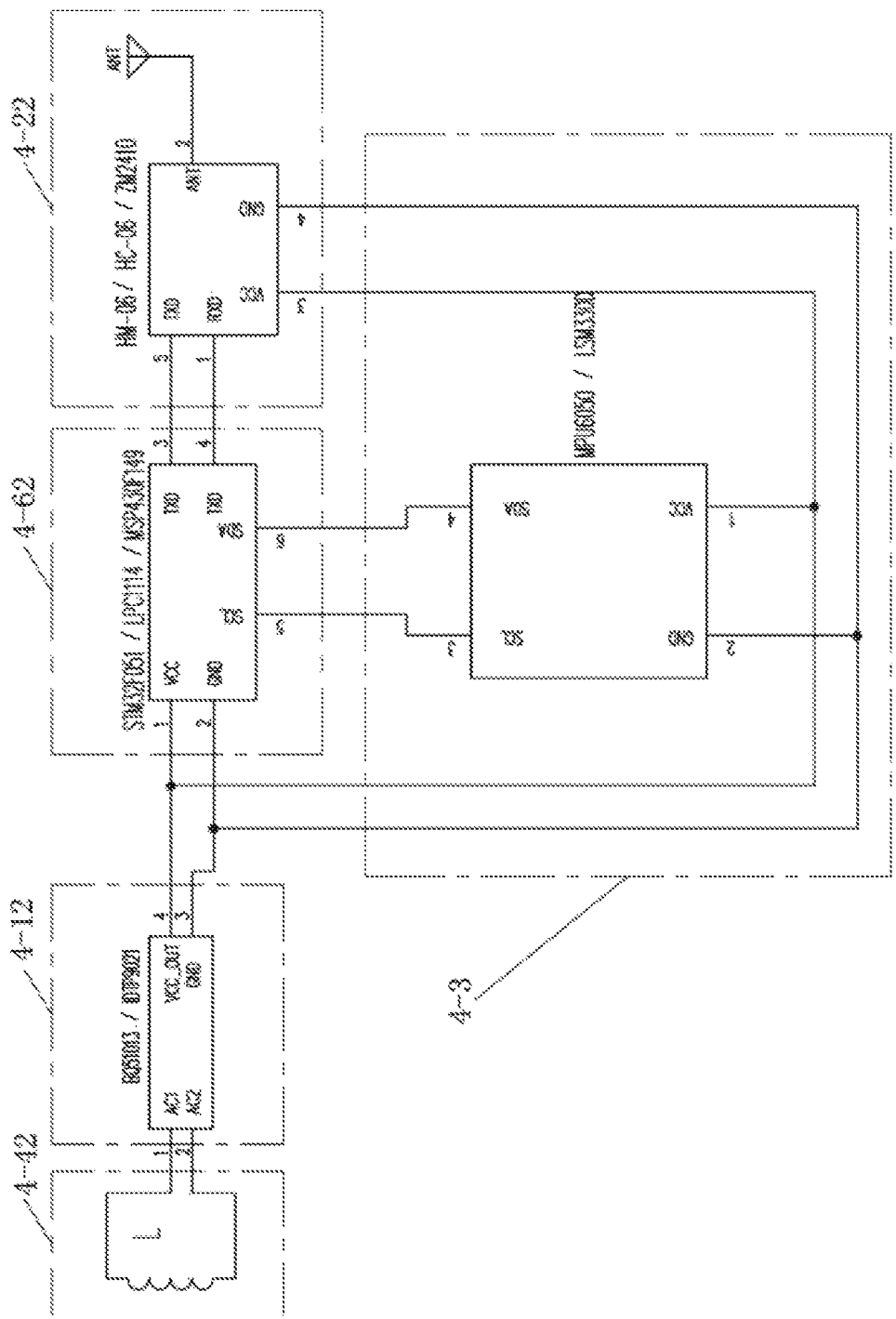
FIG. 23 is a circuit diagram of a circuit of the inertial sensing device of FIG. 19.
Figure 24:
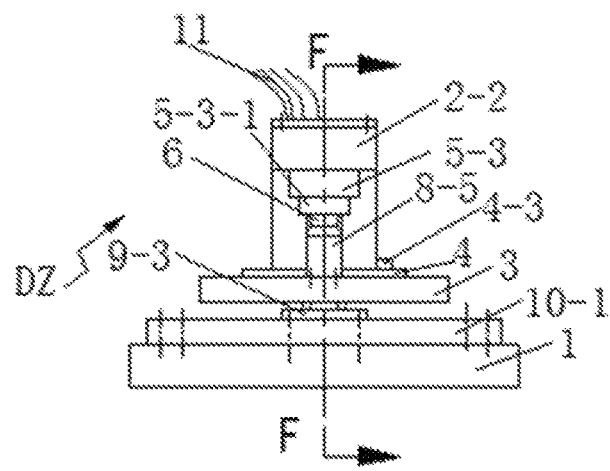
FIG. 24 is a structural view of an inertial sensing device according to a sixth embodiment of the present invention in which a first wire 11 is lead from a circuit board 4.
Figure 25:
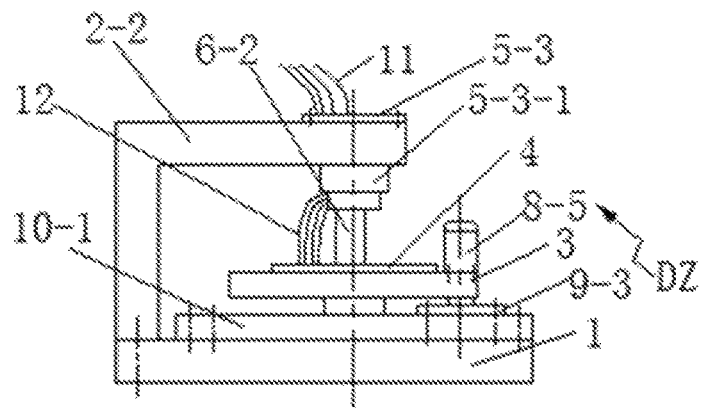
FIG. 25 is a left view of the inertial sensing device of FIG. 24.
Figure 26:
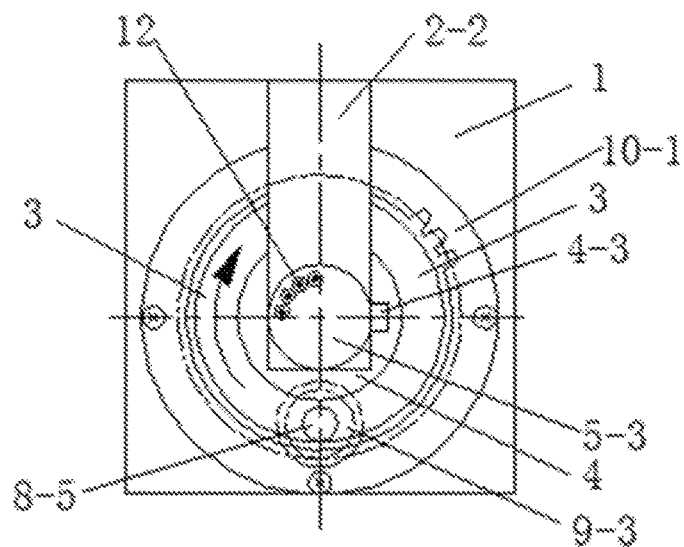
FIG. 26 is a top view of the inertial sensing device of FIG. 24.
Figure 27:
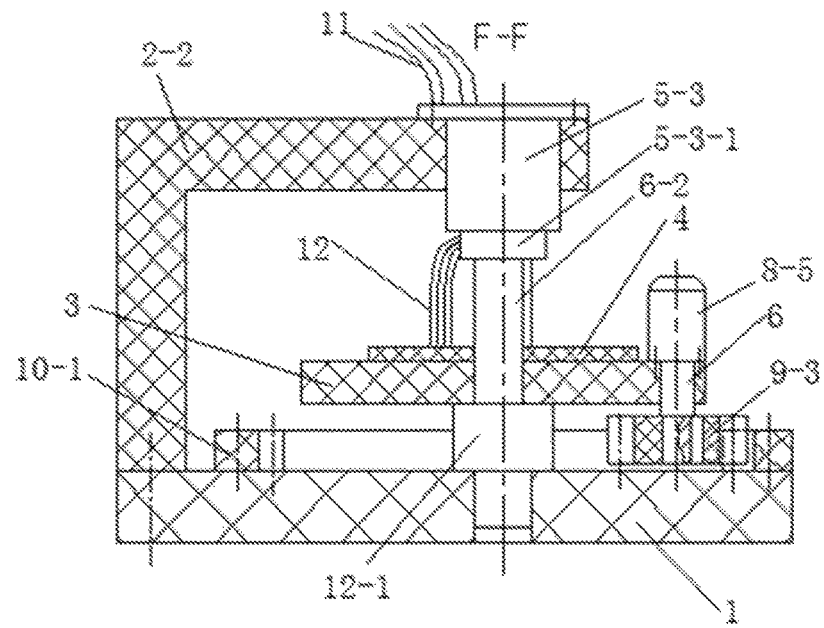
FIG. 27 is a cross section view of the inertial sensing device of FIG. 24 at a position similar to line F-F.
Figure 28:
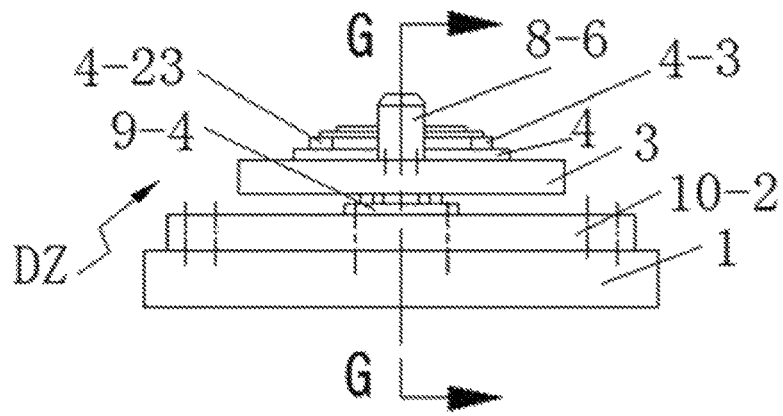
FIG. 28 is a structural view of an inertial sensing device according to a seventh embodiment of the present invention.
Figure 29:
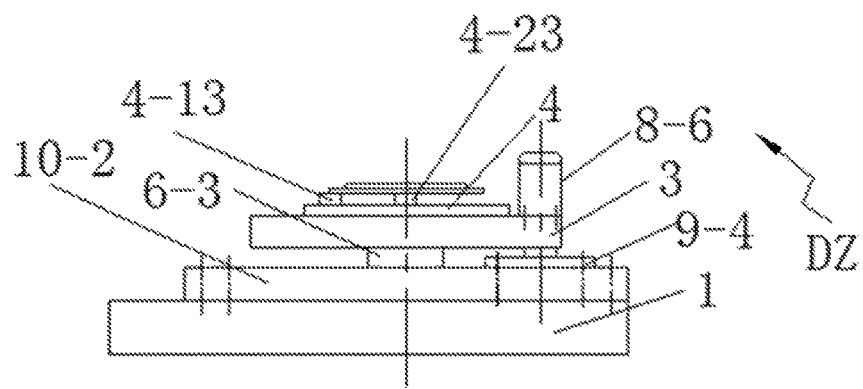
FIG. 29 is a left view of the inertial sensing device of FIG. 28.
Figure 30:
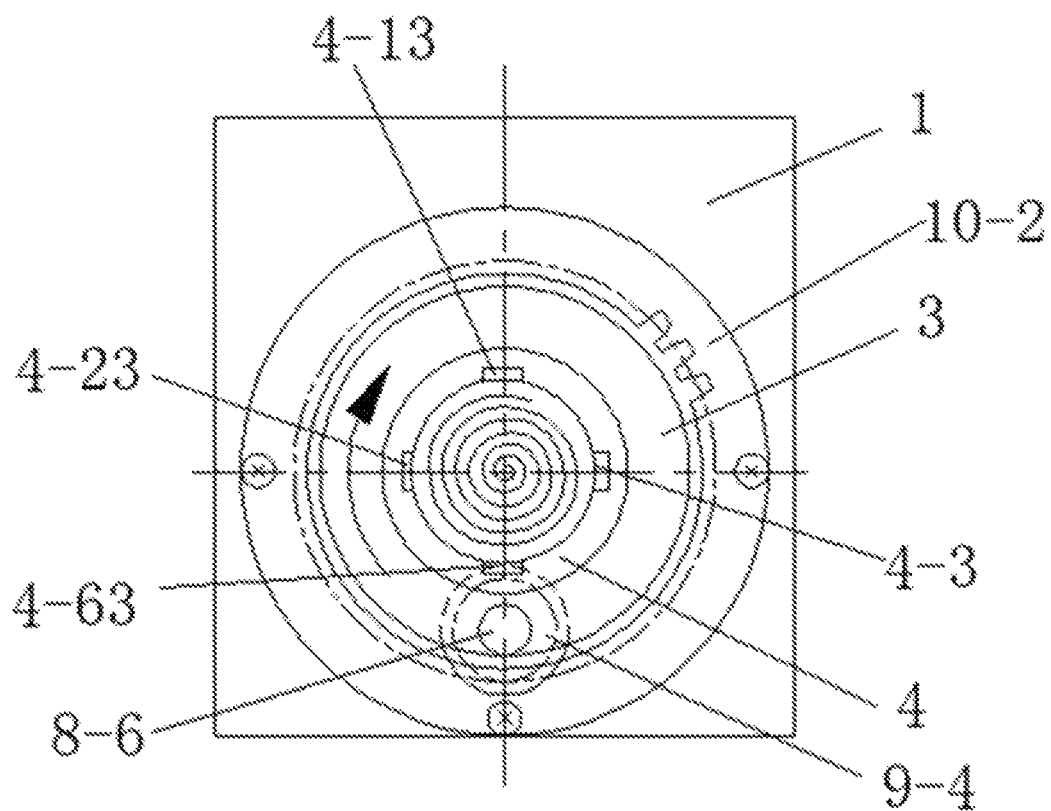
FIG. 30 is a top view of the inertial sensing device of FIG. 28.
Figure 31:
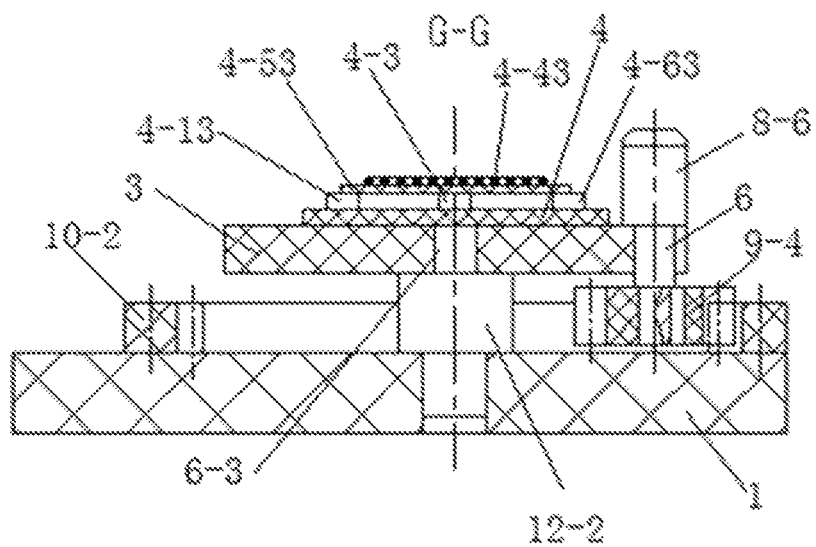
FIG. 31 is a cross section view of the inertial sensing device of FIG. 28 at a position similar to line G-G.
Figure 32:
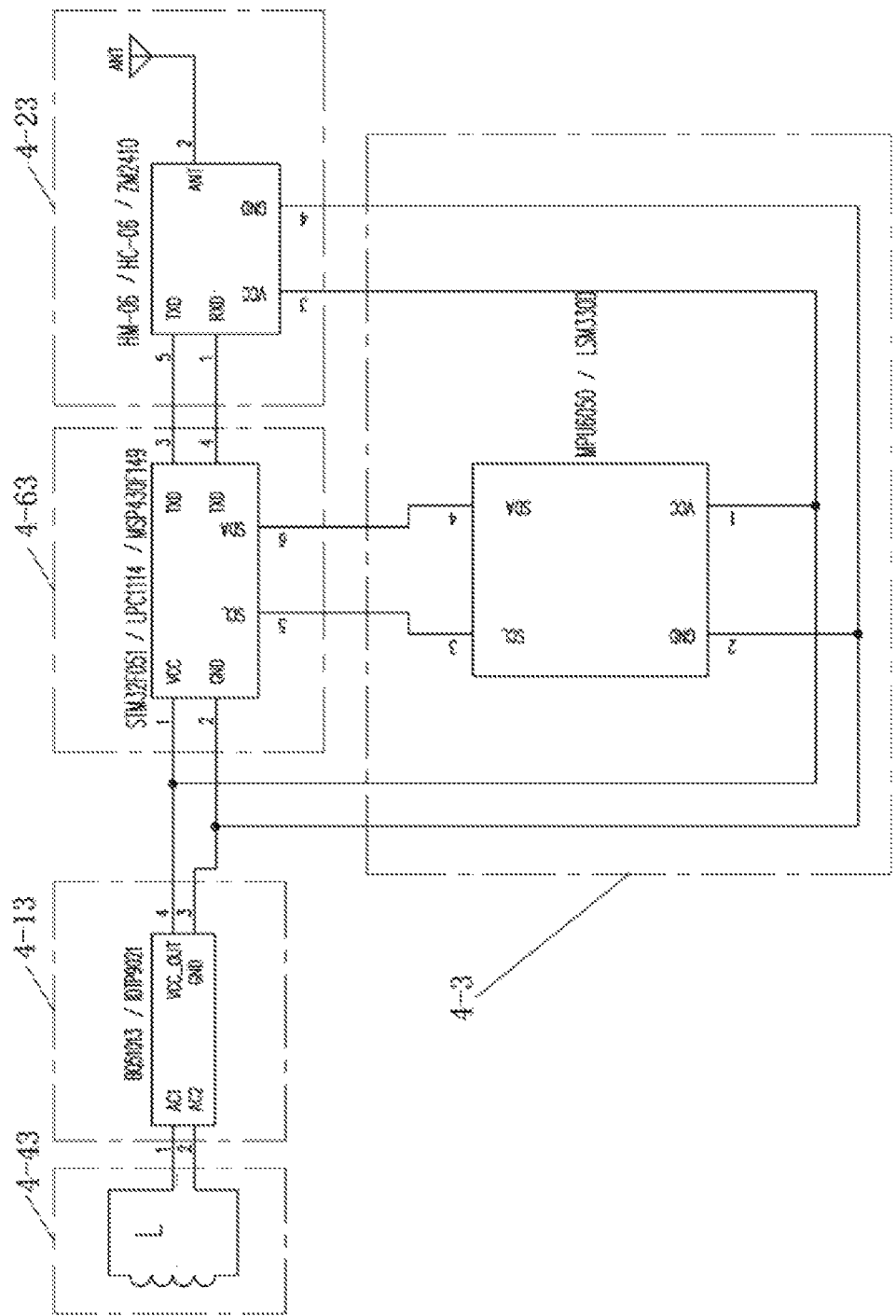
FIG. 32 is a circuit diagram of a circuit of the inertial sensing device of FIG. 28.

Reference will now be made in detail to the present preferred embodiments to provide a further understanding of the invention, examples of which are illustrated in the accompanying drawings.

Embodiment 1

As shown in FIG. 1 to FIG. 4, the inertial sensing device comprises a circuit board 4 and an inertial sensor 4-3 provided on the circuit board 4. The inertial sensing device also comprises a base 1, a rotating plate 3 and a power source assembly DZ. The power source assembly DZ is mounted on the base 1, the rotating plate 3 is drivingly connected to a power output shaft 6 of the power source assembly DZ. The circuit board 4 rotates along with the rotating plate 3 in a reciprocating manner or a continuous manner. The rotating plate 3 rotates at a speed in the range of 1 to 200 RPM. The inertial sensing device is combined with a monitored movable target under operating conditions. A signal collected by the inertial sensor 4-3 is transmitted to a personal navigation system, which displays the instantaneous geographic position of the monitored movable target. The inertial sensor of the present invention can be mounted on a user's feet or shoe either in indoor environment or outdoor environment.

The power source assembly DZ comprises a first speed reducer 7-1 and a first motor 8-1 which are both mounted on the base 1. The first speed reducer 7-1 is drivingly connected to the first motor 8-1 and has the power output shaft 6. In other words, the power output shaft 6 is a power output shaft of the first speed reducer 7-1. The rotating plate 3 is sleeved on the power output shaft of the first speed reducer 7-1. In order to prevent wires lead from the circuit board 4 winding each other, the circuit board 4 rotates along with the rotating plate 3 in a reciprocating manner.

The circuit board 4 can be adhered to the rotating plate 3; it can also be fixed to the rotating plate 3 through engagement of protrusions and holes; or else, the circuit board 4 and the rotating plate 3 can be riveted, but not limited thereto. The circuit board and the rotating plate can be assembled together in other ways.

According to the first embodiment, under operation conditions, the first motor 8-1 drives the rotation of the power output shaft of the first speed reducer 7-1. Since the rotating plate 3 is sleeved on the power output shaft of the first speed reducer 7-1, the circuit board 4 rotates along with the rotating plate 3 in a reciprocating manner.

Embodiment 2

Please referring to FIG. 5-FIG. 9, compared with the first embodiment, the inertial sensing device of the second embodiment has the following differences: the circuit board 4 further comprises a first wireless power receiving module 4-11, a first wireless communication module 4-21, a first wireless power receiving coil 4-41, a first insulating sheet 4-51 and a first microprocessor 4-61. The first wireless power receiving coil 4-41 is mounted on the circuit board 4 through the first insulating sheet 4-51, and is electrically connected to a corresponding connection terminal of the first wireless power receiving module 4-11. The first wireless power receiving module 4-11, the first wireless communication module 4-21 and the inertial sensor 4-3 are electrically connected to corresponding connection terminals of the first microprocessor 4-61 respectively. Other structures of the inertial sensing device are the same as those of the first embodiment.

According to the second embodiment, the modules on the circuit board 4 communicate to each other wirelessly, which prevents winding of wires leading from the circuit board 4, such that the circuit board 4 can rotate along with the rotating plate 3 in a reciprocating manner or a continuous manner.

Under operation conditions, the first motor 8-1 drives the rotation of the power output shaft of the first speed reducer 7-1. Since the rotating plate 3 is sleeved on the power output shaft of the first speed reducer 7-1, the circuit board 4 rotates along with the rotating plate 3 in a reciprocating manner or a continuous manner. The circuit board 4 is further mounted with the first wireless power receiving module 4-11, the first wireless communication module 4-21, the first wireless power receiving coil 4-41, the first insulating sheet 4-51 and the first microprocessor 4-61. Wherein, the first wireless power receiving coil 4-41 receives external electromagnetic energy through electromagnetic induction and transmits the energy to the first wireless power receiving module 4-11, the first wireless power receiving module 4-11 converts the electromagnetic energy into DC voltage and outputs the DC voltage to the inertial sensor 4-3, the first wireless communication module 4-21 and the first microprocessor 4-61. The first microprocessor 4-61 reads measurement data from the inertial sensor 4-3 and sends it to the first wireless communication module 4-21, which transmits the measurement data to an external receiving device in a wireless way. The above wireless powering and wireless communication avoid wire winding during the continuous rotation of the circuit board.

Embodiment 3

Please referring to FIG. 10 to FIG. 14, compared with the first embodiment, the inertial sensing device of the third embodiment has the following differences: the inertial sensing device further comprises a first frame 2-1 and a first slip ring 5-1. The first frame 2-1 has an inverted L-shape with a lower portion fixed on the base 1 and a top portion mounted with the first slip ring 5-1. The power source assembly DZ comprises a second speed reducer 7-2 and a second motor 8-2 which are both mounted on the base 1. The second speed reducer 7-2 is drivingly connected to the second motor 8-2 and has the power output shaft. In other words, the power output shaft 6 is a power output shaft of the second speed reducer 7-2. The rotating plate 3 is sleeved on the power output shaft of the second speed reducer 7-2. A first rotor 5-1-1 of the first slip ring 5-1 is drivingly connected to the power output shaft of the second speed reducer 7-2. Other structures of the inertial sensing device are the same as those of the first embodiment.

According to the third embodiment, under operation conditions, the second motor 8-2 drives the rotation of the power output shaft of the second speed reducer 7-2. Since the rotating plate 3 is sleeved on the power output shaft of the second speed reducer 7-2, the circuit board 4 rotates along with the rotating plate 3 in a reciprocating manner or a continuous manner. The stator of the first slip ring 5-1 is fixedly connected to the first frame 2-1, the rotor 5-1-1 of the first slip ring 5-1 is sleeved on and connected to the power output shaft 6. The second wire 12 is connected to the circuit board 4. The first wire 11 and the second wire 12 are electrically connected through a sliding contact of a conducting ring and a brush between the rotor 5-1-1 and the stator of the first slip ring 5-1. As a result, the first wire 11 can transmit power and data to the inertial sensor 4-3, which enables transmission of current and electrical signals under the continuous rotation of the inertial sensor without wire winding.

Embodiment 4

Please referring to FIG. 15 to FIG. 18, compared with the first embodiment, the inertial sensing device of the fourth embodiment has the following differences: the inertial sensing device further comprises a second slip ring 5-2 which is mounted on the base 1. A second rotor 5-2-1 of the second slip ring 5-2 is assembled to the rotating plate 3. The power source assembly DZ comprises a third speed reducer 7-3, a third motor 8-3 and a first driving gear 9-1. The third speed reducer 7-3 and the third motor 8-3 are both mounted on the base 1, and the third speed reducer 7-3 is drivingly connected to the third motor 8-3. The third speed reducer 7-3 has the power output shaft 6. In other words, the power output shaft 6 is a power output shaft 6 of the third speed reducer 7-3. The first driving gear 9-1 is sleeved on the power output shaft of the third speed reducer 7-3. The rotating plate 3 is a driven gear engaged with the first driving gear 9-1. Other structures of the inertial sensing device are the same as those of the first embodiment.

According to the fourth embodiment, under operation conditions, the third motor 8-3 drives the rotation of the power output shaft of the third speed reducer 7-3, which also drives the rotation of the first driving gear 9-1. Since the rotating plate 3 is the driven gear engaged with the first driving gear 9-1, the circuit board 4 rotates along with the rotating plate 3 in a reciprocating manner or a continuous manner. The stator of the second slip ring 5-2 is fixedly connected to the base 1, the rotor 5-2-1 of the second slip ring 5-2 is sleeved on and connected to the rotating plate 3. The second wire 12 is connected to the circuit board 4. The first wire 11 and the second wire 12 are electrically connected through a sliding contact of a conducting ring and a brush between the rotor 5-2-1 and the stator of the second slip ring 5-2. As a result, the first wire 11 can transmit power and data to the inertial sensor 4-3, which enables transmission of current and electrical signals under the continuous rotation of the inertial sensor without wire winding.

Embodiment 5

Please referring to FIG. 19 to FIG. 23, compared with the first embodiment, the inertial sensing device of the fifth embodiment has the following differences: the power source assembly DZ comprises a fourth speed reducer 7-4, a fourth motor 8-4, a first rotating shaft 6-1 and a second driving gear 9-2. The fourth speed reducer 7-4 and the fourth motor 8-4 are both mounted on the base 1, and the fourth speed reducer 7-4 is drivingly connected to the fourth motor 8-4. The fourth speed reducer 7-4 has the power output shaft, that is, the power output shaft 6 is a power output shaft of the fourth speed reducer 7-4. The second driving gear 9-2 is sleeved on the power output shaft of the fourth speed reducer 7-4. The rotating plate 3 is a driven gear engaged with the second driving gear 9-2. The first rotating shaft 6-1 is assembled to the base 1, the rotating plate 3 is assembled to the first rotating shaft 6-1. The circuit board 4 further comprises a second wireless power receiving module 4-12, a second wireless communication module 4-22, a second wireless power receiving coil 4-42, a second insulating sheet 4-52 and a second microprocessor 4-62. The second wireless power receiving coil 4-42 is mounted on the circuit board 4 through the second insulating sheet 4-52 and is electrically connected to a corresponding connection terminal of the second wireless power receiving module 4-12. The second wireless power receiving module 4-12, the second wireless communication module 4-22 and the inertial sensor 4-3 are electrically connected to corresponding connection terminals of the second microprocessor 4-62 respectively. Other structures of the inertial sensing device are the same as those of the first embodiment.

According to the fifth embodiment, under operation conditions, the fourth motor 8-4 drives the rotation of the power output shaft of the fourth speed reducer 7-4, which also drives the rotation of the second driving gear 9-2. Since the rotating plate 3 is the driven gear engaged with the second driving gear 9-2, the circuit board 4 rotates along with the rotating plate 3 in a reciprocating manner or a continuous manner. The circuit board 4 is further mounted with the second wireless power receiving module 4-12, the second wireless communication module 4-22, the second wireless power receiving coil 4-42, the second insulating sheet 4-52 and the second microprocessor 4-62. Wherein, the second wireless power receiving coil 4-42 receives external electromagnetic energy through electromagnetic induction and transmits the energy to the second wireless power receiving module 4-12, the second wireless power receiving module 4-12 converts the electromagnetic energy into DC voltage and outputs the DC voltage to the inertial sensor 4-3, the second wireless communication module 4-22 and the second microprocessor 4-62. The second microprocessor 4-62 reads measurement data from the inertial sensor 4-3 and sends it to the second wireless communication module 4-22, which transmits the measurement data to an external receiving device in a wireless way. The above wireless powering and wireless communication avoid wire winding during the continuous rotation of the circuit board.

Embodiment 6

Please referring to FIG. 24 to FIG. 27, compared with the first embodiment, the inertial sensing device of the sixth embodiment has the following differences: the inertial sensing device further comprises a second frame 2-2 and a third slip ring 5-3. The second frame 2-2 has an inverted L-shape with a lower portion fixed on the base 1 and a top portion mounted with the third slip ring 5-3. The power source assembly DZ comprises a fifth motor 8-5, a first positioning block 12-1, a third driving gear 9-3, a first internal gear 10-1 and a second rotating shaft 6-2. The fifth motor 8-5 is mounted on the rotating plate 3 and has the power output shaft 6. In other words, the power output shaft 6 is a power output shaft of the fifth motor 8-5, which is assembled to the third driving gear 9-3 by passing through the rotating plate 3. The third driving gear 9-3 is engaged with internal gear teeth of the first internal gear 10-1. The first internal gear 10-1 and the first positioning block 12-1 are both fixed on the base 1, the first positioning block 12-1 is disposed inside the first internal gear 10-1. One terminal of the second rotating shaft 6-2 passes through the first positioning block 12-1 to be assembled to the base 1. The rotating plate 3 and the circuit board 4 are arranged on an upper surface of the first positioning block 12-1 by receiving the second rotating shaft 6-2. The other terminal of the second rotating shaft 6-2 is assembled to a third rotor 5-3-1 of the third slip ring 5-3. Other structures of the inertial sensing device are the same as those of the first embodiment.

According to the sixth embodiment, under operation conditions, the fifth motor 8-5 drives the rotation of the power output shaft, which also drives the rotation of the third driving gear 9-3. Since the power output shaft of the fifth motor 8-5 is assembled to the third driving gear 9-3 by passing through the rotating plate 3 and the third driving gear 9-3 is engaged with the internal gear teeth of the first internal gear 10-1, the circuit board 4 rotates along with the rotating plate 3 in a reciprocating manner or a continuous manner. The stator of the third slip ring 5-3 is fixedly connected to the second frame 2-2, the rotor 5-3-1 of the second slip ring 5-2 is sleeved on and connected to the second rotating shaft 6-2. The second wire 12 is connected to the circuit board 4. The first wire 11 and the second wire 12 are electrically connected through a sliding contact of a conducting ring and a brush between the rotor 5-3-1 and the stator of the second slip ring 5-3. As a result, the first wire 11 can transmit power and data to the inertial sensor 4-3, which enables transmission of current and electrical signals under the continuous rotation of the inertial sensor without wire winding.

Embodiment 7

Please referring to FIG. 28 to FIG. 32, compared with the first embodiment, the inertial sensing device of the seventh embodiment has the following differences: the power source assembly DZ comprises a sixth motor 8-6, a second positioning block 12-2, a fourth driving gear 9-4, a second internal gear 10-2 and a third rotating shaft 6-3. The sixth motor 8-6 is mounted on the rotating plate 3 and has the power output shaft 6. In other words, the power output shaft 6 is a power output shaft of the sixth motor 8-6, which is assembled to the fourth driving gear 9-4 by passing through the rotating plate 3. The fourth driving gear 9-4 is engaged with internal gear teeth of the second internal gear 10-2. The second internal gear 10-2 and the second positioning block 12-2 are both fixed on the base 1, the second positioning block 12-2 is disposed inside the second internal gear 10-2. One terminal of the third rotating shaft 6-3 passes through the second positioning block 12-2 to be assembled to the base 1. The rotating plate 3 and the circuit board 4 are arranged on an upper surface of the second positioning block 12-2 by receiving the third rotating shaft 6-3. The circuit board 4 further comprises a third wireless power receiving module 4-13, a third wireless communication module 4-23, a third wireless power receiving coil 4-43, a third insulating sheet 4-53 and a third microprocessor 4-63. The third wireless power receiving coil 4-43 is mounted on the circuit board 4 through the third insulating sheet 4-53 and is electrically connected to a corresponding connection terminal of the third wireless power receiving module 4-13. The third wireless power receiving module 4-13, the third wireless communication module 4-23 and the inertial sensor 4-3 are electrically connected to corresponding connection terminals of the third microprocessor respectively 4-63. Other structures of the inertial sensing device are the same as those of the first embodiment.

According to the seventh embodiment, under operation conditions, the sixth motor 8-6 drives the rotation of the power output shaft, which also drives the rotation of the fourth driving gear 9-4. Since the power output shaft of the sixth motor 8-6 is assembled to the fourth driving gear 9-4 by passing through the rotating plate 3 and the fourth driving gear 9-4 is engaged with the internal gear teeth of the second internal gear 10-2, the circuit board 4 rotates along with the rotating plate 3 in a reciprocating manner or a continuous manner. The circuit board 4 is further mounted with the third wireless power receiving module 4-13, the third wireless communication module 4-23, the third wireless power receiving coil 4-42, the third insulating sheet 4-53 and the third microprocessor 4-63. Wherein, the third wireless power receiving coil 4-43 receives external electromagnetic energy through electromagnetic induction and transmits the energy to the third wireless power receiving module 4-13, the third wireless power receiving module 4-13 converts the electromagnetic energy into DC voltage and outputs the DC voltage to the inertial sensor 4-3, the third wireless communication module 4-23 and the third microprocessor 4-63. The third microprocessor 4-63 reads measurement data from the inertial sensor 4-3 and sends it to the third wireless communication module 4-22, which transmits the measurement data to an external receiving device in a wireless way. The above wireless powering and wireless communication avoid wire winding during continuous rotation of the circuit board.

The wireless powering receiving module is preferred to use a wireless powering module BQ51013 manufactured by Texas Instrument, Inc. or a wireless powering module IDTP9021 manufactured by Integrated Device Technology, Inc. The wireless communication module is preferred to use a Bluetooth module HM-06 manufactured by Jinan Huamao Technology Co, Ltd., a Bluetooth module HC-06H manufactured by Guangzhou Huicheng Info Technology Co, Ltd., or a ZigBee module ZM2410 manufactured by Guangzhou Zhiyuan Electronics Co., Ltd. The microprocessor is preferred to use a microprocessor STM32F051 manufactured by STMicroelectronics, a microprocessor LPC1114 manufactured by NXP B.V., or a microprocessor MSP430F149 manufactured by Texas Instrument Inc. The inertial sensor is preferred to use an inertial sensor MPU6050 or a gyroscope ITG3205 manufactured by InvenSense, or an accelerometer-combined inertial sensor ADXL345 manufactured by Analog Devices.

The slip ring is preferred to use a micro slip ring LPMS-06A manufactured by Shenzhen Jingpei Electronics Co., Ltd., or a micro slip ring MMC182 manufactured by Shenzhen Mofulong Technology Co, Ltd.

It is noted that other product models can be selected for the above modules. The insulating sheet helps to prevent interference between the wireless powering receiving coil and the circuit board.

The slip ring described throughout the disclosure is a precise electromechanical device used in the field of sliding electrical contact application that allows the transmission of image, data and power between two relative rotating structures. It can also be called as collecting ring, rotary joint, collector, coil, or commutator.

The slip ring is a precise electromechanical device that allows the transmission of power and electrical signals from a stationary structure to a rotating structure through sliding contact, electrostatic coupling or electromagnetic coupling of the rotating conductive ring, it can be widely applied in all kinds of electromechanical systems which require continuous or intermittent 360° rotation and multi-path transmission of power, data and signal. The slip ring has a simplified structure which also avoids wire damage during the rotation.

Figure 33:
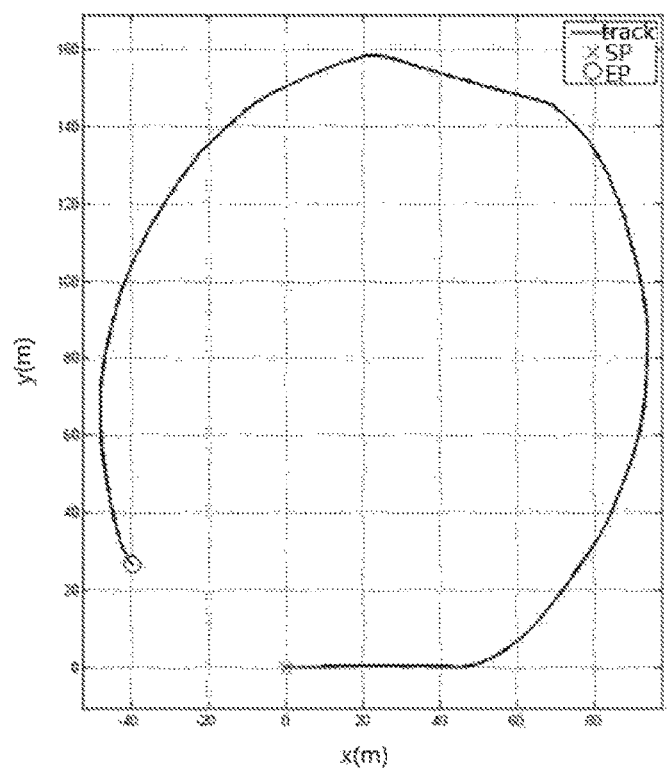
FIG. 33 is a calculated motion diagram of a conventional stationary inertial sensor under operating conditions.
Figure 34:
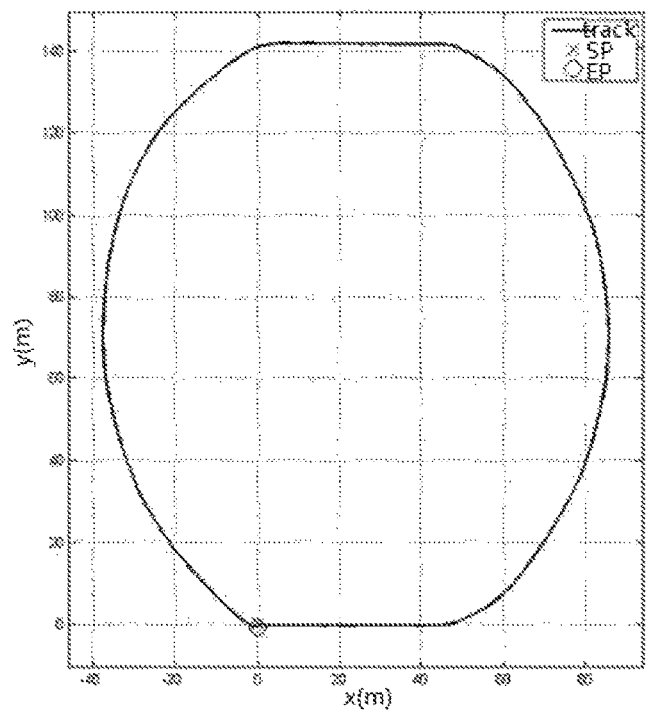
FIG. 34 is a calculated motion diagram of a rotatable inertial sensor of the present invention under operating conditions.

FIG. 33 and FIG. 34 are calculated motion diagrams of a stationary inertial sensor and a rotating inertial sensor mounted on a user's feet or shoe when the user walks along a same circular path. The circular path has a perimeter of 400 meters with a start point and an end point at the same position.

As shown in FIG. 33, due to the zero drift of the conventional stationary inertial sensor, the bias between the calculated heading direction and the actual heading direction increases with the time, causing a large offset between the calculated end position and the start point. As shown in FIG. 34, the inertial sensor of the present invention is rotated under operation conditions, which modulates most of the zero drift and controls the bias between the calculated heading direction and the actual heading direction within a small range. As a result, the calculated end position is substantially the same with the start point, thereby greatly improving the navigation accuracy.

Figure 35:
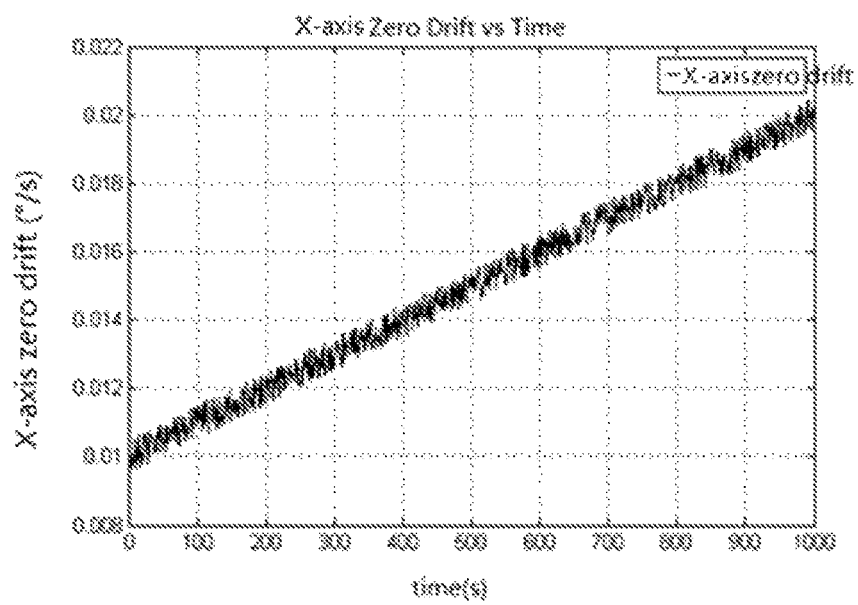
FIG. 35 is a diagram illustrating the relationship between the zero drift of a gyroscope of the inertial sensor in the direction of a sensitive axis X and time when the gyroscope is stationary.
Figure 36:
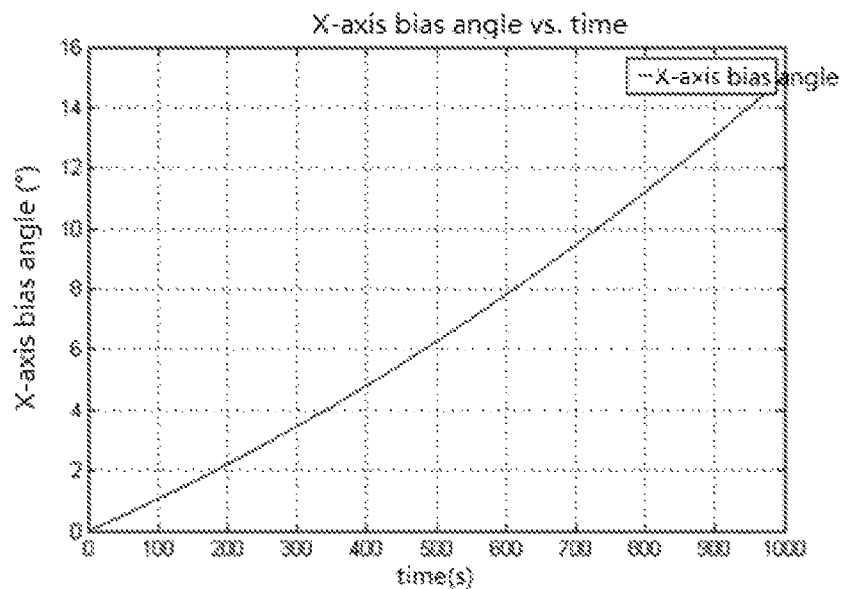
FIG. 36 is a diagram illustrating the relationship between the calculated bias angle in the direction of the sensitive axis X and time when the gyroscope is stationary.

When the inertial sensor is stationary, it can be found in the diagram illustrating the relationship between the zero drift in the direction of the sensitive axis X of the inertial sensor and time (FIG. 35) and the diagram illustrating the relationship between the calculated bias angle in the direction of the sensitive axis X and time (FIG. 36), even for a very small zero drift (0.01°/hour-0.02°/hour), the integrated bias angle in the direction of the sensitive axis X will be continually divergent with time. After 1000 seconds, the bias angle reaches 15°.

Figure 37:
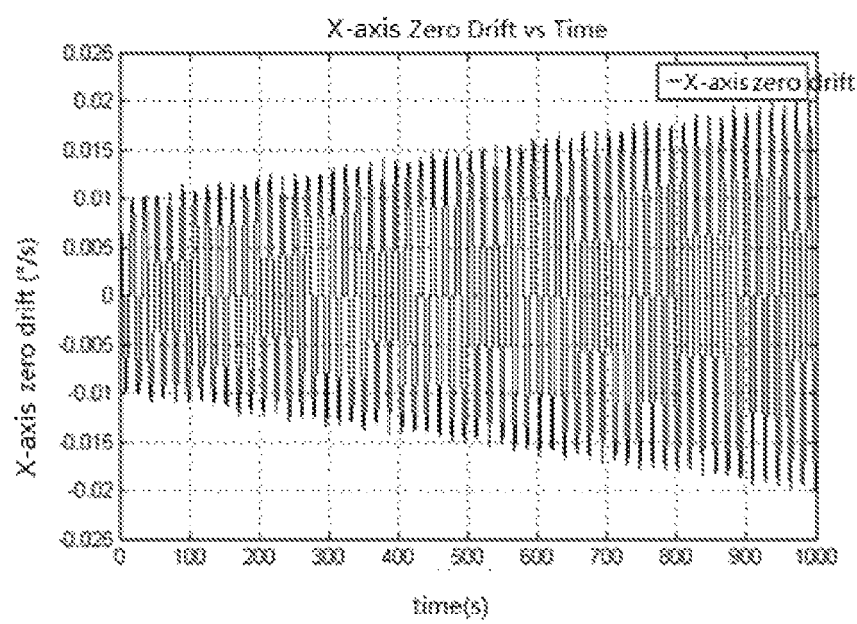
FIG. 37 is a diagram illustrating the relationship between the zero drift of a gyroscope of the inertial sensor in the direction of a sensitive axis X and time when the gyroscope is rotated.
Figure 38:
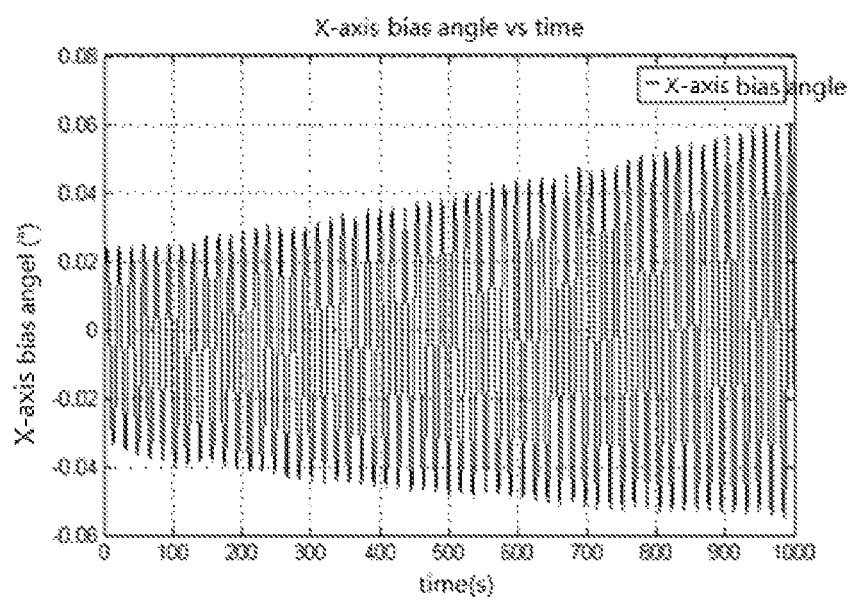
FIG. 38 is a diagram illustrating the relationship between the calculated bias angle in the direction of the sensitive axis X and time when the gyroscope is rotated.

When the inertial sensor is rotated, it can be found in the diagram illustrating the relationship between the zero drift in the direction of the sensitive axis X of the inertial sensor and time (FIG. 37) and the diagram illustrating the relationship between the calculated bias angle in the direction of the sensitive axis X and time (FIG. 38), the magnitude and direction of the zero drift in the direction of the sensitive axis X of the inertial sensor is periodically changed during rotation, which controls the integrated bias angle in the X direction within 0.1°.

Although the gyroscope of the inertial sensor is an ordinary MEMS gyroscope, it can achieve a navigation accuracy of 1°/hour to provide a precise long time navigation and positioning for the personal navigation system. Since the rotation structure is low in production cost, there is no need to use expensive gyroscope with high precision, the system cost is significantly reduced.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. An inertial sensing device comprising a circuit board (4) and an inertial sensor (4-3) provided on the circuit board (4), wherein the inertial sensing device further comprising: a base (1), a rotating plate (3) and a power source assembly (DZ); the circuit board (4) is mounted on the rotating plate (3), the power source assembly (DZ) is mounted on the base (1), the rotating plate (3) is drivingly connected to a power output shaft (6) of the power source assembly; the circuit board (4) rotates along with the rotating plate (3) in a reciprocating manner or a continuous manner at a rotation speed of 1 to 200 RPM; the inertial sensing device is combined with a monitored movable target under operating conditions, a signal collected by the inertial sensor (4-3) is transmitted to a personal navigation system to display an instantaneous geographic position of the monitored movable target wherein, the circuit board (4) further comprises a first wireless power receiving module (4-11), a first wireless communication module (4-21), a first wireless power receiving coil (4-41), a first insulating sheet (4-51) and a first microprocessor (4-61); the first wireless power receiving coil (4-41) is mounted on the circuit board (4) through the first insulating sheet (4-51) and is electrically connected to a corresponding connection terminal of the first wireless power receiving module (4-11); the first wireless power receiving module (4-11), the first wireless communication module (4-21) and the inertial sensor (4-3) are electrically connected to corresponding connection terminals of the first microprocessor (4-61) respectively; or, the inertial sensing device further comprises a first frame (2-1) and a first slip ring (5-1); the first frame (2-1) has an inverted L-shape with a lower portion fixed on the base (1) and a top portion mounted with the first slip ring (5-1); wherein the power source assembly (DZ) comprises a second motor (8-2) and a second speed reducer (7-2) drivingly connected to the second motor (8-2), which are both mounted on the base (1); the power output shaft (6) is a power output shaft of the second speed reducer (7-2) which is sleeved by the rotating plate (3); a first rotor (5-1-1) of the first slip ring (5-1) is drivingly connected to the power output shaft of the second speed reducer (7-2); or, the inertial sensing device further comprises a second slip ring (5-2) which is mounted on the base (1); a second rotor (5-2-1) of the second slip ring (5-2) is assembled to the rotating plate (3); the power source assembly comprises a third motor (8-3), a third speed reducer (7-3) drivingly connected to the third motor (8-3) which are both mounted on the base (1), and a first driving gear (9-1); the power output shaft (6) is a power output shaft of the third speed reducer (7-3) and is sleeved by the first driving gear (9-1); the rotating plate (3) is a driven gear engaged with the first driving gear (9-1); or, the power source assembly (DZ) comprises a fourth motor (8-4), a fourth speed reducer (7-4) drivingly connected to the fourth motor (8-4) which are both mounted on the base (1), a first rotating shaft (6-1) and a second driving gear (9-2); the power output shaft (6) is a power output shaft of the fourth speed reducer (7-4) which is sleeved by the second driving gear (9-2); the rotating plate (3) is a driven gear engaged with the second driving gear (9-2); the first rotating shaft (6-1) is assembled to the base (1), the rotating plate (3) is assembled to the first rotating shaft (6-1); the circuit board (4) further comprises a second wireless power receiving module (4-12), a second wireless communication module (4-22), a second wireless power receiving coil (4-42), a second insulating sheet (4-52) and a second microprocessor (4-62); the second wireless power receiving coil (4-42) is mounted on the circuit board (4) through the second insulating sheet (4-52) and is electrically connected to a corresponding connection terminal of the second wireless power receiving module (4-12); the second wireless power receiving module (4-12), the second wireless communication module (4-22) and the inertial sensor (4-3) are electrically connected to corresponding connection terminals of the second microprocessor (4-62) respectively; or, the inertial sensing device further comprises a second frame (2-2) and a third slip ring (5-3); wherein the second frame (2-2) has an inverted L-shape with a lower portion fixed on the base (1) and a top portion mounted with the third slip ring (5-3); the power source assembly (DZ) comprises a fifth motor (8-5), a first positioning block (12-1), a third driving gear (9-3), a first internal gear (10-1) and a second rotating shaft (6-2); the fifth motor (8-5) is mounted on the rotating plate (3); the power output shaft (6) is a power output shaft of the fifth motor (8-5) which is assembled to the third driving gear (9-3) by passing through the rotating plate (3); the third driving gear (9-3) is engaged with internal gear teeth of the first internal gear (10-1); the first internal gear (10-1) and the first positioning block (12-1) are both fixed on the base (1), the first positioning block (12-1) is disposed inside the first internal gear (10-1); one terminal of the second rotating shaft (6-2) passes through the first positioning block (12-1) to be assembled to the base (1), the rotating plate (3) and the circuit board (4) are arranged on an upper surface of the first positioning block (12-1) by receiving the second rotating shaft (6-2); the other terminal of the second rotating shaft (6-2) is assembled to a third rotor (5-3-1) of the third slip ring (5-3); or, the power source assembly (DZ) comprises a sixth motor (8-6), a second positioning block (12-2), a fourth driving gear (9-4), a second internal gear (10-2) and a third rotating shaft (6-3); the sixth motor (8-6) is mounted on the rotating plate (3); the power output shaft (6) is a power output shaft of the sixth motor (8-6) which is assembled to the fourth driving gear (9-4) by passing through the rotating plate (3); the fourth driving gear (9-4) is engaged with internal gear teeth of the second internal gear (10-2); the second internal gear (10-2) and the second positioning block (12-2) are both fixed on the base (1), the second positioning block (12-2) is disposed inside the second internal gear (10-2); one terminal of the third rotating shaft (6-3) passes through the second positioning block (12-2) to be assembled to the base (1), the rotating plate (3) and the circuit board (4) are arranged on an upper surface of the second positioning block (12-2) by receiving the third rotating shaft (6-3); the circuit board (4) further comprises a third wireless power receiving module (4-13), a third wireless communication module (4-23), a third wireless power receiving coil (4-43), a third insulating sheet (4-53) and a third microprocessor (4-63); the third wireless power receiving coil (4-43) is mounted on the circuit board (4) through the third insulating sheet (4-53) and is electrically connected to a corresponding connection terminal of the third wireless power receiving module (4-13); the third wireless power receiving module (4-13), the third wireless communication module (4-23) and the inertial sensor (4-3) are electrically connected to corresponding connection terminals of the third microprocessor (4-63) respectively.

\* \* \* \* \*